(12) United States Patent
Yin et al.

(10) Patent No.: US 7,842,994 B2
(45) Date of Patent: Nov. 30, 2010

(54) NONVOLATILE MEMORY TRANSISTOR HAVING POLY-SILICON FIN, STACKED NONVOLATILE MEMORY DEVICE HAVING THE TRANSISTOR, METHOD OF FABRICATING THE TRANSISTOR, AND METHOD OF FABRICATING THE DEVICE

(75) Inventors: Huaxiang Yin, Yongin-si (KR); Young-soo Park, Yongin-si (KR); Wenxu Xianyu, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 225 days.

(21) Appl. No.: 12/007,037

(22) Filed: Jan. 4, 2008

(65) Prior Publication Data
US 2008/0191247 A1 Aug. 14, 2008

(30) Foreign Application Priority Data
Feb. 12, 2007 (KR) .................... 10-2007-0014553

(51) Int. Cl.
*H01L 29/788* (2006.01)
(52) U.S. Cl. .................... 257/316; 257/319; 257/321; 257/324
(58) Field of Classification Search ................ 257/316, 257/319, 321, 324
See application file for complete search history.

(56) References Cited

U.S. PATENT DOCUMENTS

| 5,496,756 | A | * | 3/1996 | Sharma et al. | ............... | 438/258 |
| 2008/0237684 | A1 | * | 10/2008 | Specht et al. | ............... | 257/316 |

* cited by examiner

*Primary Examiner*—Thien F Tran
(74) *Attorney, Agent, or Firm*—Harness, Dickey & Pierce, P.L.C.

(57) ABSTRACT

A nonvolatile memory transistor having a poly-silicon fin, a stacked nonvolatile memory device having the transistor, a method of fabricating the transistor, and a method of fabricating the device are provided. The device may include an active fin protruding upward from a semiconductor substrate. At least one first charge storing pattern on a top surface and sidewalls of the active fin may be formed. At least one first control gate line on a top surface of the at least one first charge storing pattern may be formed. The at least one first control gate line may intersect over the active fin. An interlayer dielectric layer may be formed on the at least one first control gate line. A poly-silicon fin may be formed on the interlayer dielectric layer. At least one second charge storing pattern on a top surface and sidewalls of the poly-silicon fin may be formed. At least one second control gate line on a top surface of the at least one second charge storing pattern may be formed, and the at least one second control gate line may intersect over the poly-silicon fin.

15 Claims, 25 Drawing Sheets

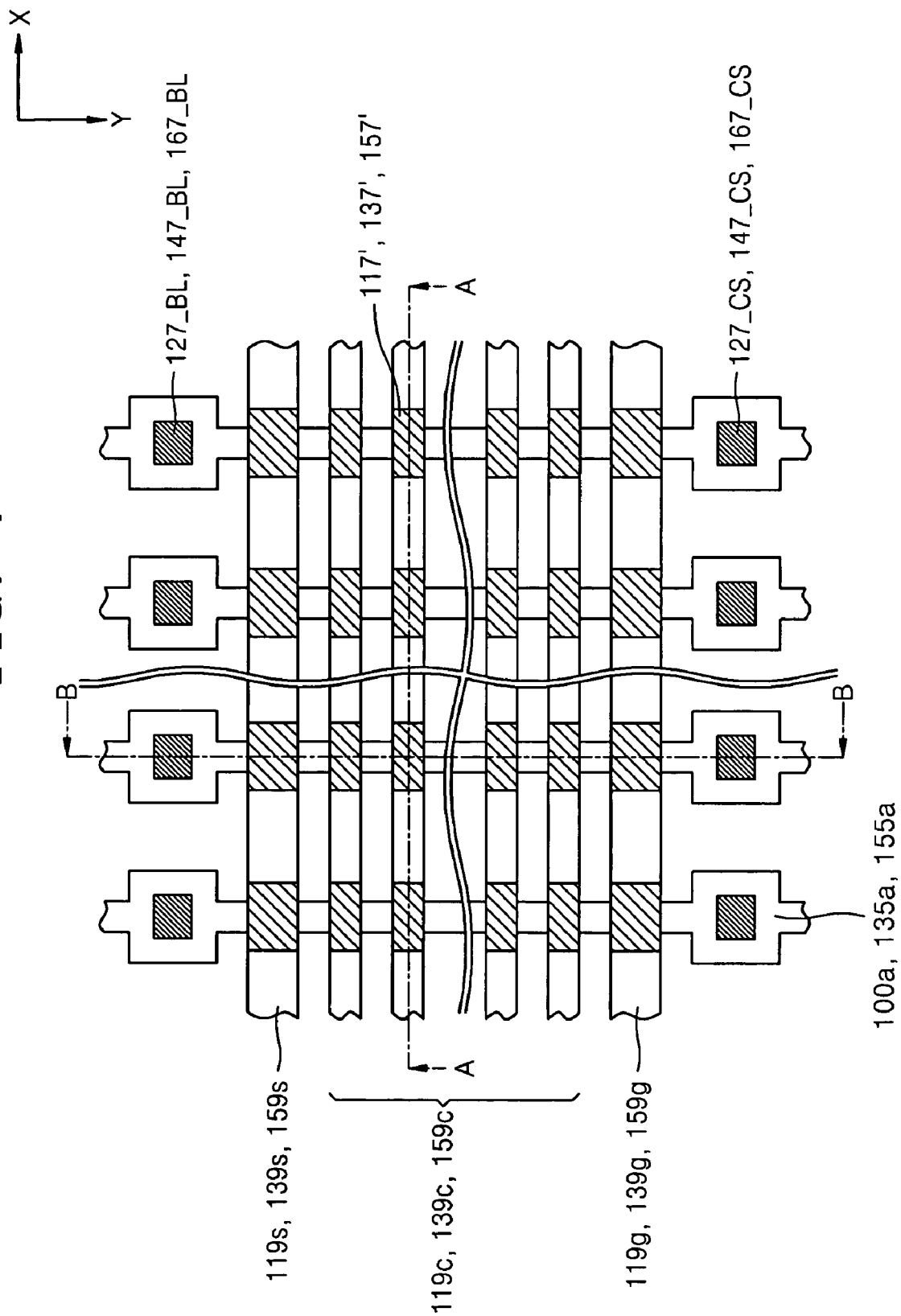

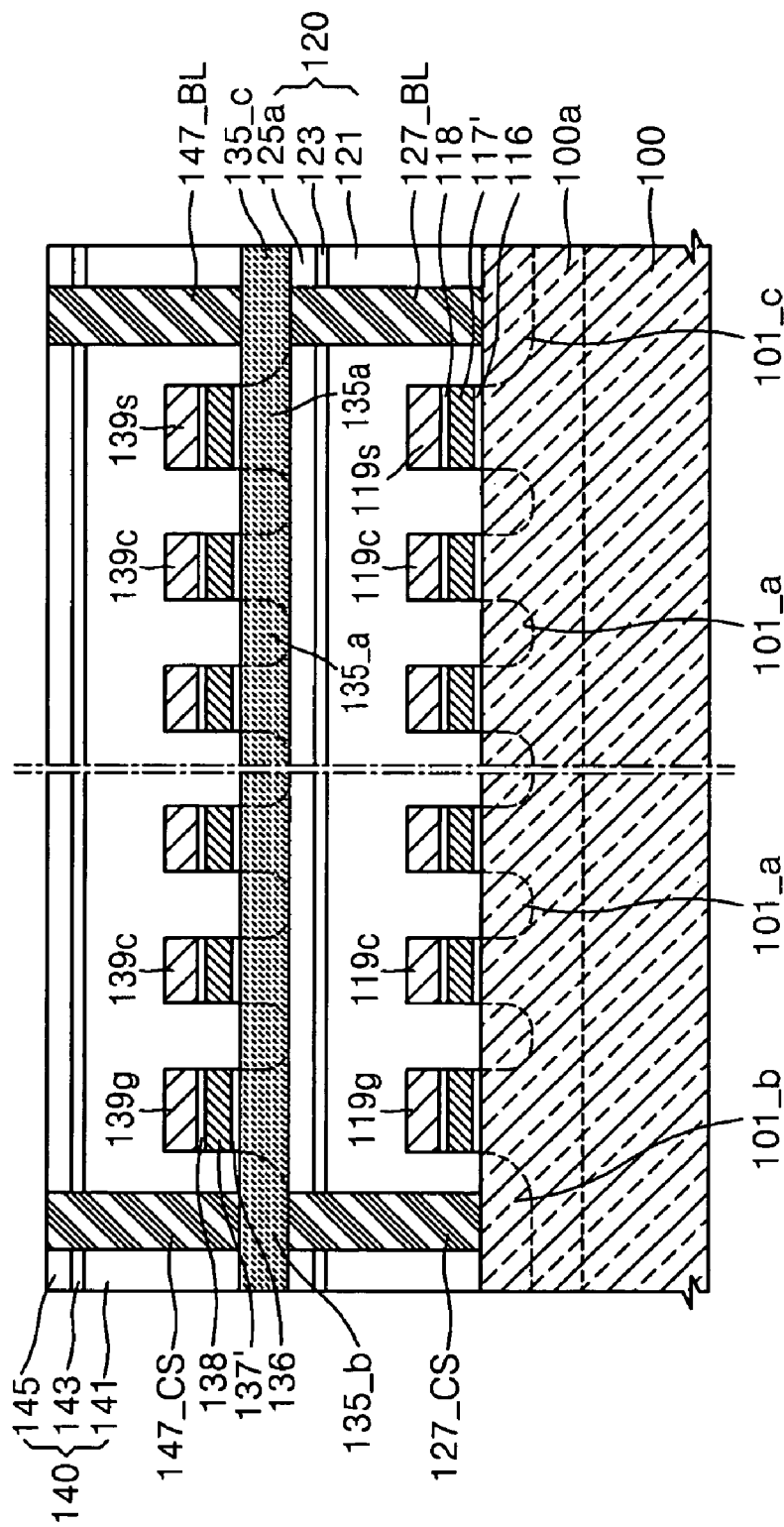

НОНVOLATILE MEMORY TRANSISTOR HAVING POLY-SILICON FIN, STACKED NONVOLATILE MEMORY DEVICE HAVING THE TRANSISTOR, METHOD OF FABRICATING THE TRANSISTOR, AND METHOD OF FABRICATING THE DEVICE

PRIORITY STATEMENT

This application claims priority under 35 U.S.C. §119 to Korean Patent Application No. 10-2007-0014553, filed on Feb. 12, 2007, in the Korean Intellectual Property Office (KIPO), the entire contents of which are incorporated herein by reference.

BACKGROUND

1. Field

Example embodiments relate to a nonvolatile memory transistor, a nonvolatile memory device having the same and methods of fabricating the same. Other example embodiments relate to a nonvolatile memory transistor having a poly-silicon fin, a stacked nonvolatile memory device having the transistor and methods of fabricating the same.

2. Description of the Related Art

In a semiconductor device employing a planar type transistor including a gate electrode formed on a semiconductor substrate and junction regions formed at both sides of the gate electrode, as the integration degree of the semiconductor device increases, attempts have been made to reduce the length of a channel. However, when reducing the length of the channel, short channel effects, e.g., drain induced barrier lowering (DIBL), a hot carrier effect and punch through, may occur. In order to prevent or reduce such short channel effects, various methods have been introduced including a method of reducing the depth of the junction region, and a method of extending the relative length of the channel by forming a groove in the channel. However, as the length of the channel is reduced down to about 50 nm or so, the methods of preventing or reducing such short channel effects have also reached limits.

SUMMARY

Example embodiments provide a nonvolatile memory transistor capable of overcoming restrictions, e.g., short channel effects and achieving an increased integration degree of the semiconductor device, a stacked nonvolatile memory device having the transistor, a method of fabricating the transistor, and a method of fabricating the device.

According to example embodiments, a stacked nonvolatile memory device is provided. The device may include an active fin protruding upward from a semiconductor substrate. At least one first charge storing pattern may be on a top surface and sidewalls of the active fin. At least one first control gate line may be on a top surface of the at least one first charge storing pattern, and may intersect over the active fin. An interlayer dielectric layer may be formed on the at least one first control gate line. A poly-silicon fin may be formed on the interlayer dielectric layer. At least one second charge storing pattern may be on a top surface and sidewalls of the poly-silicon fin. At least one second control gate line may be on a top surface of the at least one second charge storing pattern and may intersect over the poly-silicon fin.

According to example embodiments, a nonvolatile memory transistor is provided. The transistor may include a supporting portion formed on a substrate. A poly-silicon fin may be formed on the supporting portion and may have a broader width than the supporting portion. A charge storing pattern may be on a top surface, sidewalls and a bottom surface of the poly-silicon fin. A control gate line may be on a top surface of the charge storing pattern and intersects over the poly-silicon fin.

According to example embodiments, a method of fabricating a stacked nonvolatile memory device is provided. The method may include forming a trench that defines an active fin in a semiconductor substrate. A device isolation layer may be formed in a lower region of the trench such that an upper region of the active fin may be exposed above the device isolation layer. At least one first charge storing pattern may be on a top surface and sidewalls of the active fin, and at least one first control gate line may be on a top surface of the at least one first charge storing pattern and may intersect over the top surface of the active fin. An interlayer dielectric layer may be on the at least one first control gate line. A poly-silicon fin may be on the interlayer dielectric layer. At least one second charge storing pattern may be on a top surface and sidewalls of the poly-silicon fin. At least one second control gate line may be on a top surface of the at least one second charge storing pattern and intersect over the poly-silicon fin.

According to example embodiments, a method of fabricating a nonvolatile memory transistor is provided. The method may include forming an insulating layer on a substrate. A poly-silicon fin may be formed on the insulating layer. The insulating layer may be isotropically etched, thereby forming an undercut beneath the poly-silicon fin and forming a supporting portion positioned beneath the poly-silicon fin. A charge storing pattern may be on a top surface, sidewalls and a bottom surface of the poly-silicon fin, and a control gate line may be on a top surface of the charge storing pattern and may intersect over the poly-silicon fin.

BRIEF DESCRIPTION OF THE DRAWINGS

Example embodiments will be more clearly understood from the following detailed description taken in conjunction with the accompanying drawings. FIGS. 1A-12B represent non-limiting, example embodiments as described herein.

FIGS. 1A-1E are perspective views sequentially illustrating a method of fabricating a nonvolatile memory transistor having a poly-silicon fin according to example embodiments;

FIG. 3 is a scanning electron microscope (SEM) picture illustrating a poly-silicon fin according to example embodiments;

FIG. 6 is a graph illustrating a program/erase window of the nonvolatile memory transistor according to example embodiments and the conventional nonvolatile memory transistor having a planar poly-silicon layer as a channel layer;

FIG. 7 is a layout of a unit device layer provided in a stacked nonvolatile memory device, according to example embodiments.

FIG. 11 is a cross-sectional view of a stacked nonvolatile memory device according to example embodiments; and FIGS. 12A and 12B are cross-sectional views of a stacked nonvolatile memory device according to example embodiments.

Figure 1A:
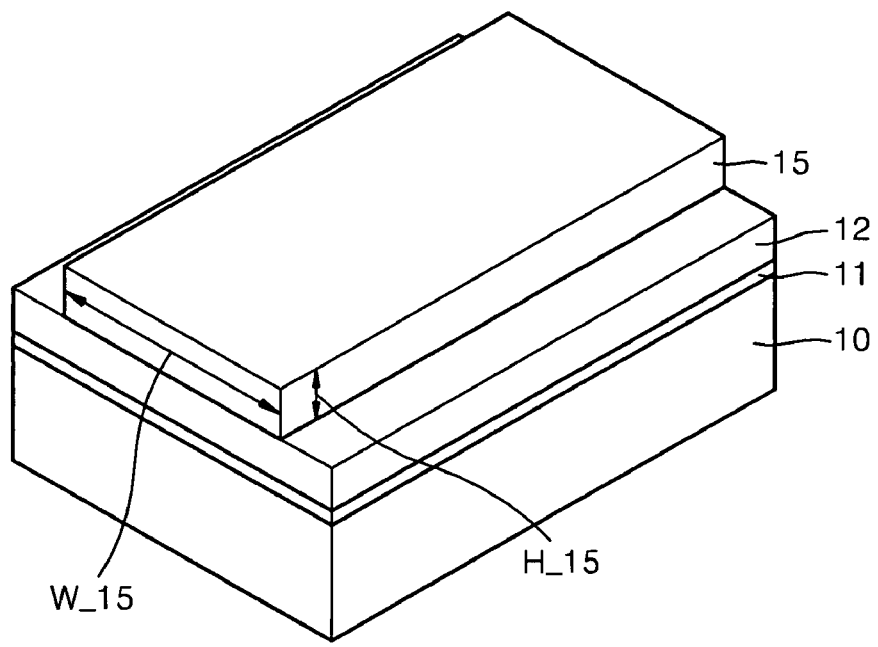

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully hereinafter with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. In the drawings, the thickness of layers, films and regions are exaggerated for clarity. Like numbers refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A-1E are perspective views sequentially illustrating a method of fabricating a nonvolatile memory transistor having a poly-silicon fin according to example embodiments. Referring to FIG. 1A, a protective layer 11 may be formed on a substrate 10, and the protective layer 11 may include a silicon nitride layer. A buffer layer 12 may be formed on the protective layer 11, and the buffer layer 12 may include a silicon oxide layer. An amorphous silicon layer may be formed on the buffer layer 12, and the amorphous silicon layer may be patterned, thereby forming the amorphous silicon pattern 15 having the shape of a line extending in one direction with a width W_15 and a height H_15.

Figure 1B:
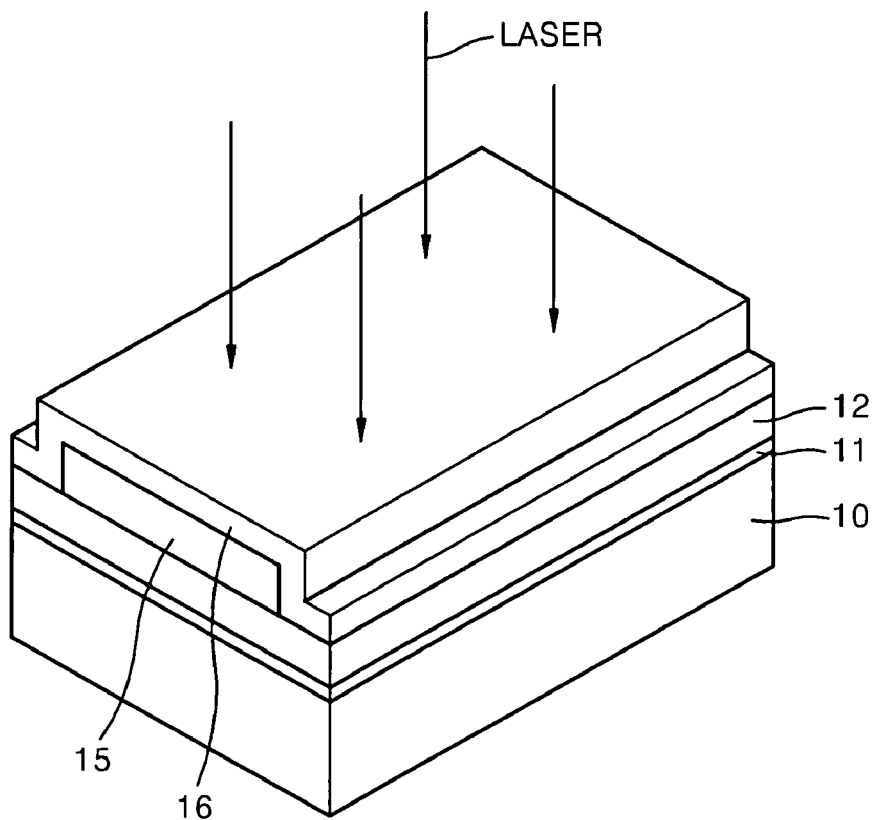

Referring to FIG. 1B, a capping layer 16 may be formed on the substrate 10 having the amorphous silicon pattern 15, and the capping layer 16 may be on or cover the amorphous silicon pattern 15. The capping layer 16 may include a silicon oxide layer through which an excimer laser beam, as described later, may be more easily transmitted. The thickness of the capping layer 16 may be about 5 nm to about 2000 nm. Subsequently, the excimer laser beam may be irradiated onto the capping layer 16, and the excimer laser beam may be transmitted through the capping layer 16 and then absorbed into the amorphous silicon pattern 15. The intensity of the excimer laser beam may be about 100 to about 2000 mJ/cm$^2$.

Figure 1C:
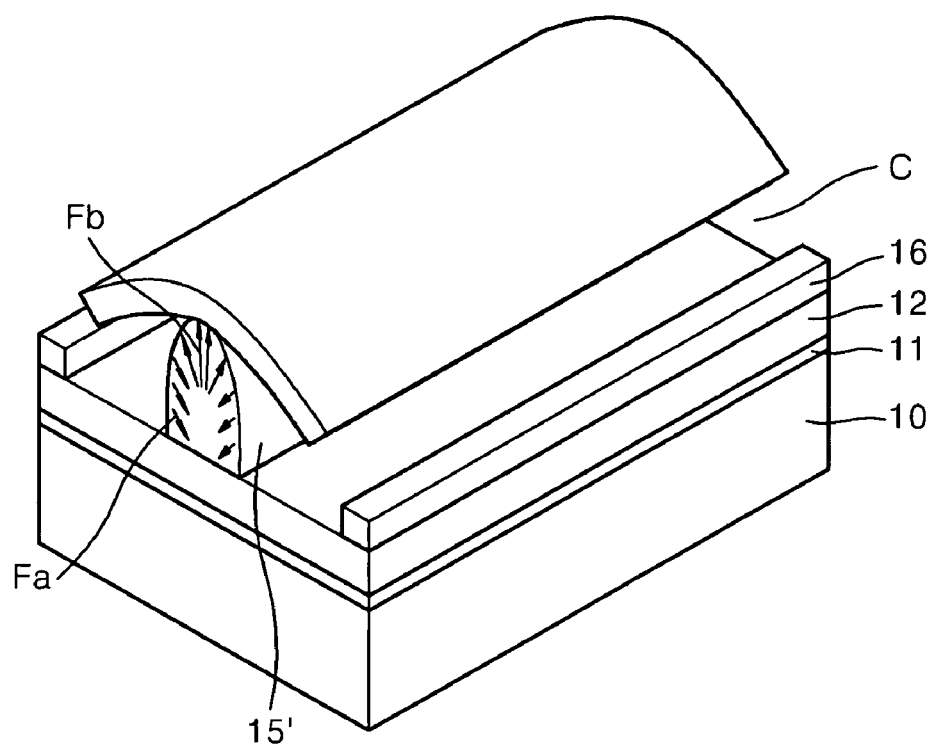

Referring to FIG. 1C, while irradiating the excimer laser beam, the amorphous silicon pattern 15 may be melted for a relatively short period of time by absorbing the excimer laser beam. The melted silicon 15' tends to have a shape similar to a hemisphere due to a shrinkage effect caused by surface tension (Fa). After irradiating the excimer laser beam, the melted silicon 15' may be gradually cooled down. A seed may be produced near a center lower portion of the melted silicon 15', at which flow of a fluid may not easily occur, and crystallization may occur upward from the seed. For example, the growth force Fb of the Si crystal may be applied upward from the center lower portion of the melted silicon 15'. Due to the surface tension Fa and the growth force Fb of the Si crystal, the melted silicon 15' may be crystallized and simultaneously changed into the shape of a pole, thereby forming a poly-silicon fin 15a (see FIG. 1D) that is pole-shaped. Because the crystallization occurs upward from the seed near the center lower portion of the melted silicon 15' as described above, a relatively large columnar-like grain may be formed in the poly-silicon fin 15a (see FIG. 1D) and may have a relatively small defect. In the crystallization process, a crack C may be produced at a step difference portion of the capping layer 16.

Figure 1D:
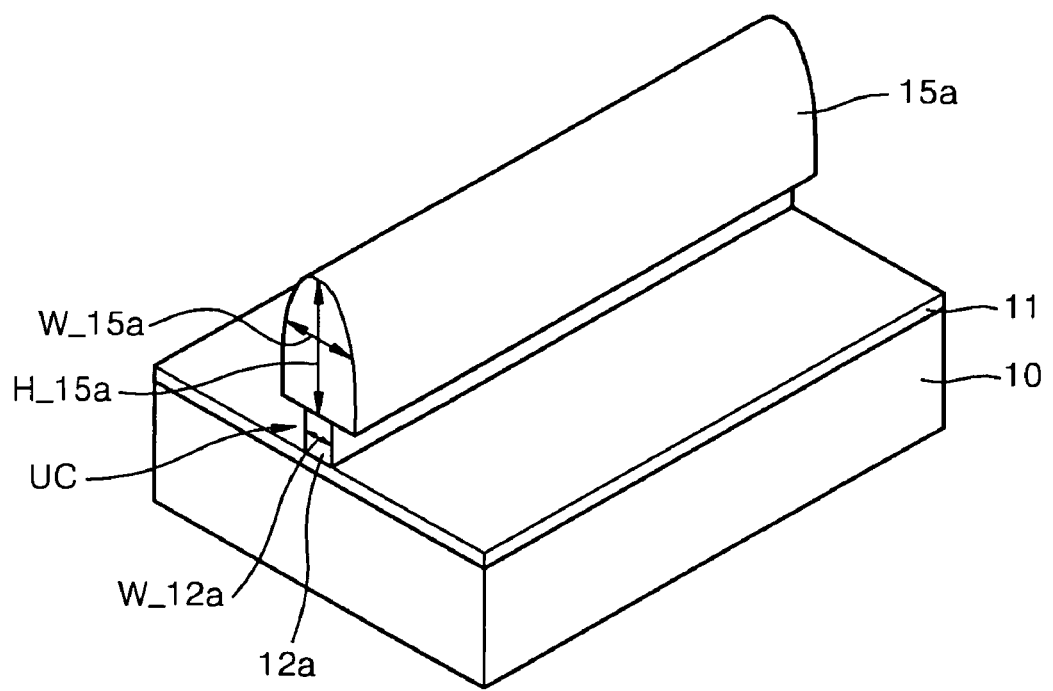

Referring to FIG. 1D, the poly-silicon fin 15a, which is pole-shaped, may be exposed by removing the capping layer 16. The mean width W_15a of the poly-silicon fin 15a is narrower than the width W_15 of the amorphous silicon pattern 15 (see FIG. 1A), and the height H_15a of the poly-silicon fin 15a is higher than the height H_15 of the amorphous silicon pattern 15 (see FIG. 1A). The height H_15a with respect to the mean width W_15a of the poly-silicon fin 15a may be about 1 or more. As described above, such a result may be shown by crystallizing the amorphous silicon pattern 15 using an excimer laser annealing (ELA) technique.

Because the mean width W_15a of the poly-silicon fin 15a is narrower than the width W_15 of the amorphous silicon pattern 15 formed through a photolithography process, a fine fin-shaped channel layer having a width narrower than the limited resolution of the photolithography process may be formed. Accordingly, the integration degree of the semiconductor device may be enhanced.

Thereafter, the buffer layer 12 may be isotropically etched using the protective layer 11 as an etch stop layer and using the amorphous silicon pattern 15 as an etch mask. As a result, a portion of the buffer layer 12 exposed surrounding the poly-silicon fin 15a may be etched, and even a portion of the buffer layer 12 positioned beneath the poly-silicon fin 15a may then be etched, thereby forming an undercut UC beneath the poly-silicon fin 15a. Thus, a remaining portion of the isotropically etched buffer layer 12 may form a supporting portion 12a beneath the poly-silicon fin 15a, and the protective layer 11 may be exposed surrounding a bottom surface of the supporting portion 12a. The width W_12a of the supporting portion 12a may be narrower than the mean width W_15a of the poly-silicon fin 15a. Thus, a bottom surface of the poly-silicon fin 15a may be exposed surrounding a top surface of the supporting portion 12a. The isotropic etching may be wet etching or isotropic dry etching. If the capping layer 16 and the buffer layer 12 are formed of the same material layer, the buffer layer 12 may be simultaneously etched while removing the capping layer 16.

Figure 1E:
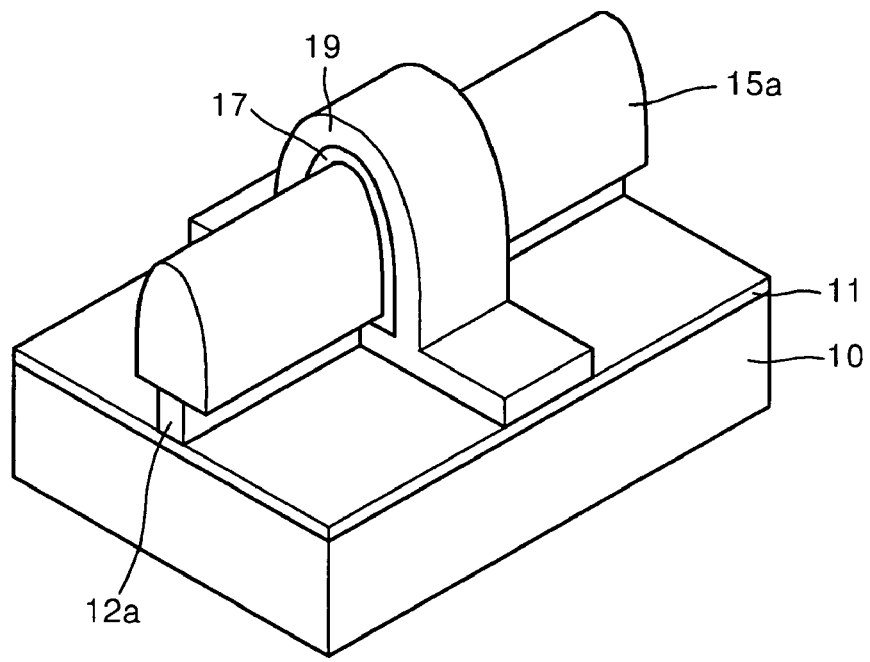

Referring to FIG. 1E, a charge storing pattern 17 may be formed on a top surface, sidewalls and the bottom surface of the poly-silicon fin 15a. A control gate line 19 intersecting over the poly-silicon fin 15a may be formed on the charge storing pattern 17. The control gate line 19 may be on or cover the top surface, sidewalls and the bottom surface of the poly-silicon fin 15a. In other words, the charge storing pattern 17 and the control gate line 19 may be formed to almost completely surround the poly-silicon fin 15a. As a result, a channel width may be broader than when the charge storing pattern 17 and the control gate line 19 are formed only on the top surface and sidewalls of the poly-silicon fin 15a. Accordingly, a leakage current may be decreased, and an on current may be increased. The charge storing pattern 17 may be a charge trapping pattern. For example, the charge trapping pattern may be a sequentially stacked silicon oxide layer/silicon nitride layer/silicon oxide layer, e.g., an oxide-nitride-oxide (ONO) layer and/or a sequentially stacked silicon oxide layer/silicon nitride layer, e.g., an oxide-nitride (ON) layer.

The charge storing pattern 17 may also be a floating gate. A gate insulating layer (not shown) may be interposed between the floating gate and the poly-silicon fin 15a. An inter-gate dielectric layer (not shown) may be interposed between the floating gate and the control gate line 19. The floating gate may be a poly-silicon layer. The control gate line 19 may be a poly-silicon layer and/or a stacked layer including a poly-silicon layer and a metal silicide layer, and the metal silicide layer may be a W, Co or Ni silicide layer.

The silicon oxide layer contacting the poly-silicon fin 15a in the charge trapping pattern and the gate insulating layer may be formed using a thermal oxidation method. The other layers in the charge trapping pattern, the floating gate, the inter-gate dielectric layer and the control gate line 19 may be formed using low pressure chemical vapor deposition (LPCVD), plasma enhanced chemical vapor deposition (PECVD), inductively coupled plasma chemical vapor deposition (ICPCVD) or atomic layer deposition (ALD).

FIGS. 2A-2D are perspective views sequentially illustrating some processes in the method of fabricating a nonvolatile memory transistor having a poly-silicon fin according to example embodiments. The method of fabricating the transistor according to example embodiments illustrated in FIGS. 2A-2D may be similar to the fabrication method described with reference to FIGS. 1A-1E, except for the following descriptions.

Figure 2A:
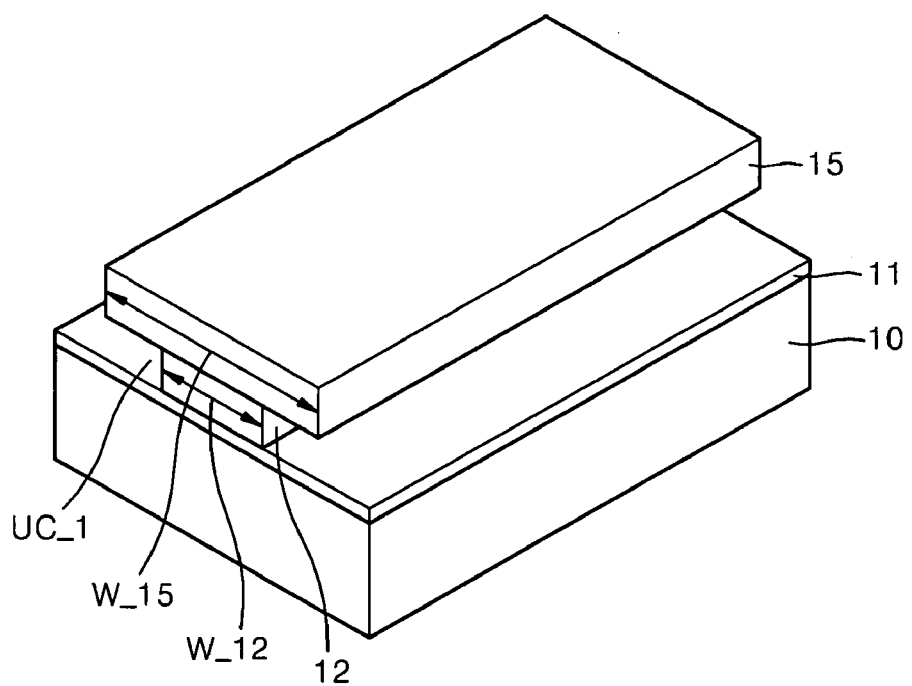
FIGS. 2A-2D are perspective views sequentially illustrating some processes in the method of fabricating a nonvolatile memory transistor having a poly-silicon fin according to example embodiments.

Referring to FIG. 2A, a protective layer 11, a buffer layer 12 and an amorphous silicon pattern 15 may be sequentially formed on a substrate 10 using the same method as the method described with reference to FIG. 1A. The buffer layer 12 may be etched using the amorphous silicon pattern 15 as a etch mask and using the protective layer 11 as an etch stop layer such that the width W_12 of the etched buffer layer 12 may be identical to or narrower than the width W_15 of the amorphous silicon pattern 15. For example, the width W_12 of the etched buffer layer 12 may be about 0.1 times to about 1 time of the width W_15 of the amorphous silicon pattern 15. If the width W_12 of the etched buffer layer 12 is identical to the width W_15 of the amorphous silicon pattern 15, the buffer layer 12 may be etched using an anisotropic etching method. On the contrary, if the width W_12 of the etched buffer layer 12 is narrower than the width W_15 of the amorphous silicon pattern 15, the buffer layer 12 may be etched using an isotropic etching method, and thus an undercut UC_1 may be formed beneath the amorphous silicon pattern 15.

Figure 2B:
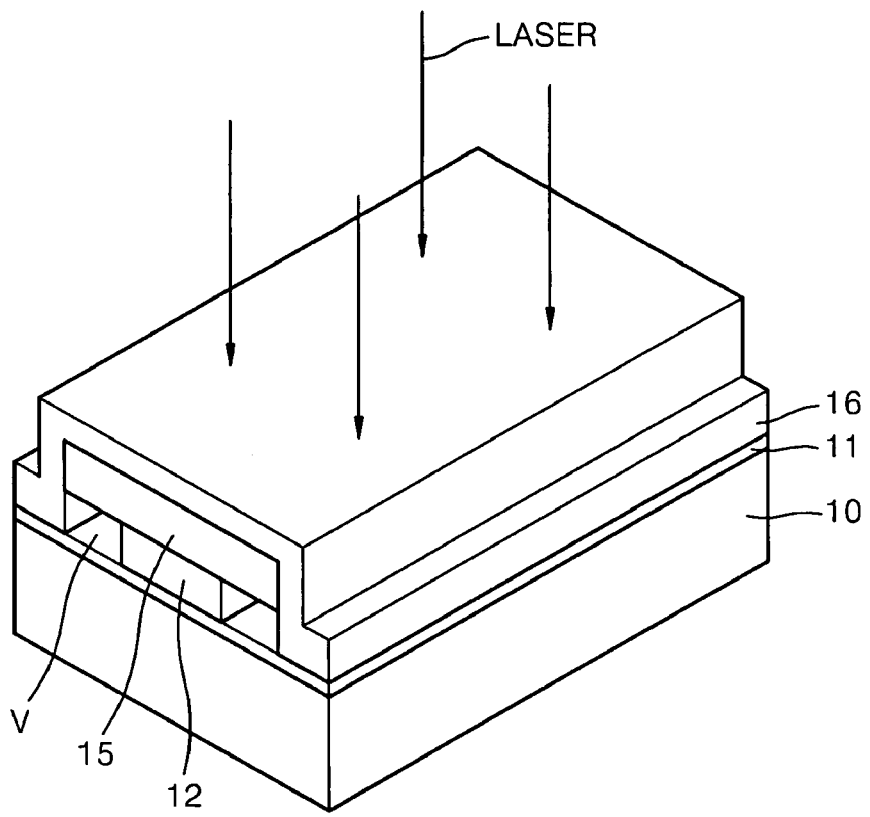

Referring to FIG. 2B, a capping layer 16, on or covering the amorphous silicon pattern 15, may be formed on the substrate 10 having the amorphous silicon pattern 15. A vacancy V may be formed between the capping layer 16, the buffer layer 12 and the amorphous silicon pattern 15 due to the undercut UC_1, and air may be filled in the vacancy V. Subsequently, an excimer laser beam may be irradiated onto the capping layer 16, and the excimer laser beam may be transmitted through the capping layer 16 and then absorbed into the amorphous silicon pattern 15.

Figure 2C:
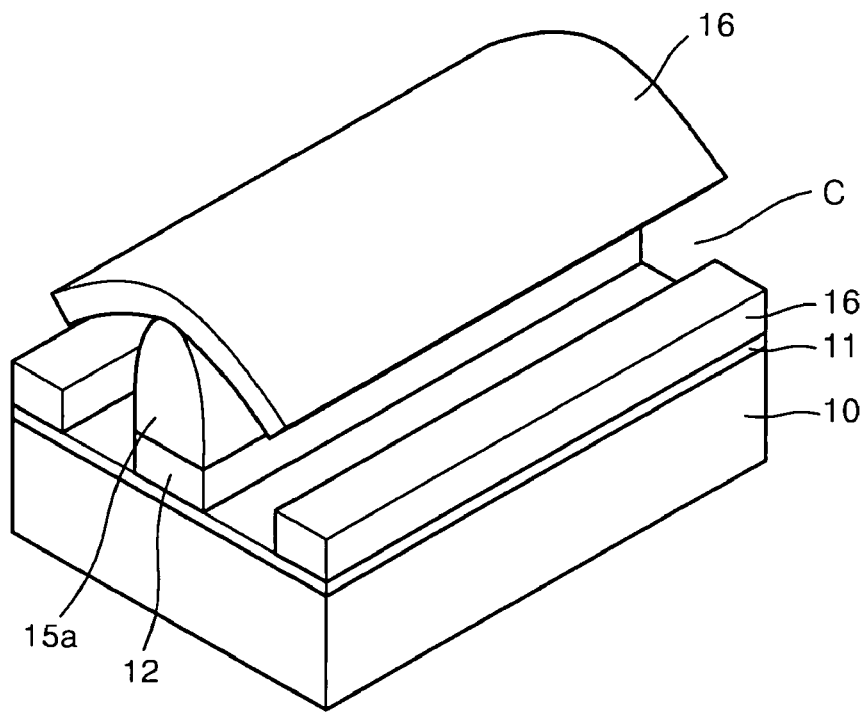

Referring to FIG. 2C, while irradiating the excimer laser beam onto the capping layer 16, the amorphous silicon pattern 15 may be melted. After irradiating the excimer laser beam onto the capping layer 16, the melted silicon may be gradually cooled down, thereby forming a poly-silicon fin 15a having the shape of a pole. When air is filled in the vacancy V, the heat conductivity of the buffer layer 12 may be higher than that of the air. When the melted silicon is cooled down, a portion contacting the buffer layer 12 may be cooled down faster than a portion contacting the vacancy V. Accordingly, the production of a seed near a center lower portion of the melted silicon and the crystallization upward from the seed may be more effectively performed. The width of a bottom surface of the poly-silicon fin 15a may be identical to or narrower than that of the buffer layer 12. In the crystallization process, a crack C may be produced at a step difference portion of the capping layer 16.

Figure 2D:
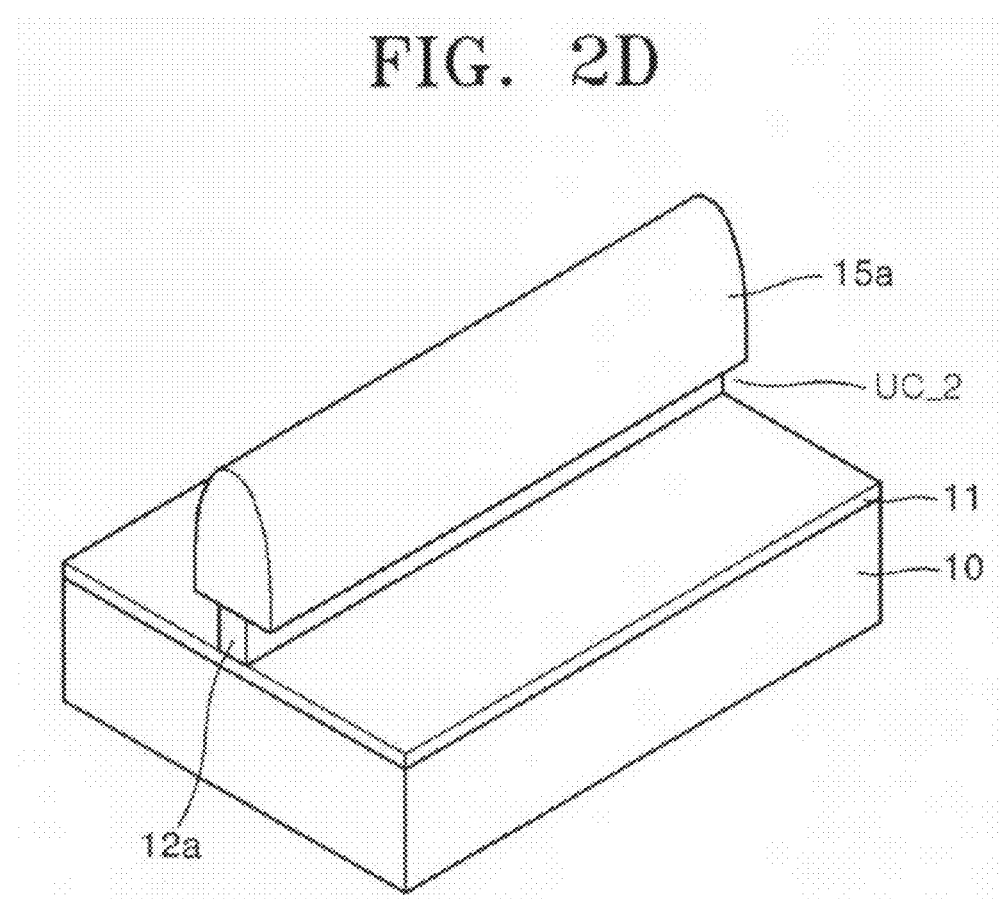

Referring to FIG. 2D, after exposing the poly-silicon fin 15a, which is pole-shaped, by removing the capping layer 16, the buffer layer 12 may be further isotropically etched using the protective layer 11 as an etch stop layer and using the poly-silicon fin 15a as an etch mask. As a result, a portion of the buffer layer 12 positioned beneath the poly-silicon fin 15a may be etched, thereby forming an undercut UC_2 beneath the poly-silicon fin 15a. The remaining portion of the isotropically etched buffer layer 12 may form a supporting portion 12a beneath the poly-silicon fin 15a. When the capping layer 16 and the buffer layer 12 are formed of the same material layer, the buffer layer 12 may be simultaneously etched while removing the capping layer 16. Thereafter, a charge storing pattern and a control gate line may be formed using the method described with reference to FIG. 1E.

Figure 3:
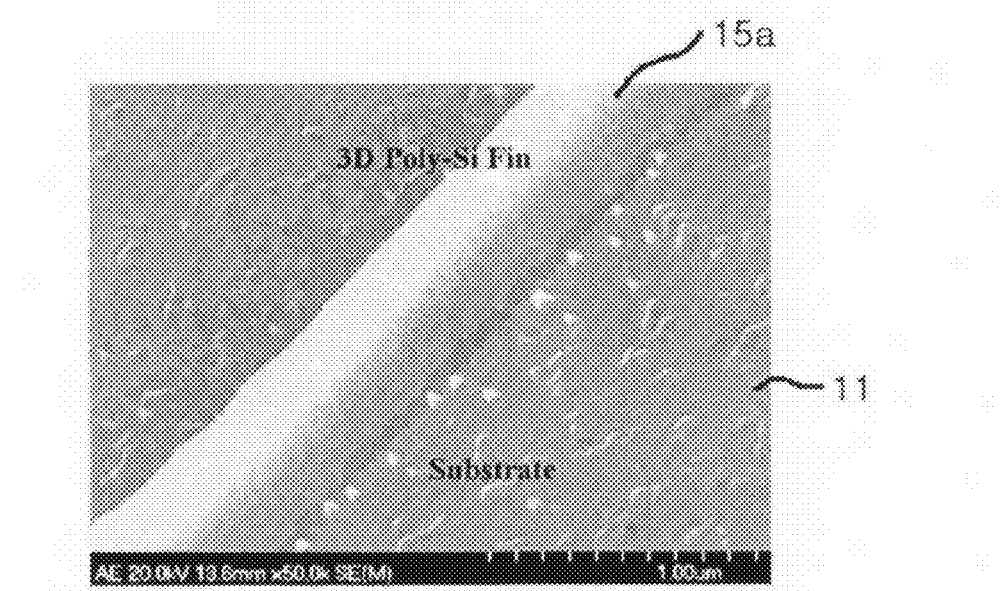

FIG. 3 is a scanning electron microscope (SEM) picture illustrating the poly-silicon fin 15a using the method described with reference to FIGS. 1A-1D, according to example embodiments. Referring to FIG. 3, the poly-silicon fin 15a having the shape of a line may be formed on the protective layer 11. The poly-silicon fin 15a may have the shape of a pole including a center portion rising above an outer portion.

Figure 4A:
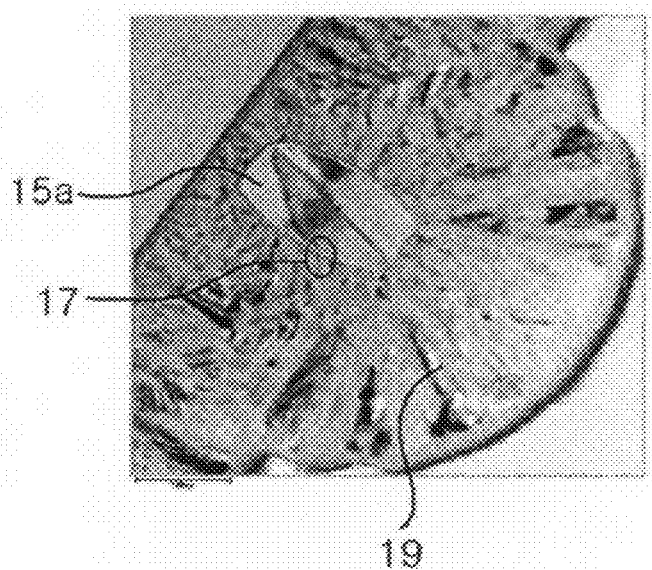
FIGS. 4A and 4B are transmission electron microscope (TEM) pictures illustrating a section of the nonvolatile memory transistor, according to example embodiments.
Figure 4B:
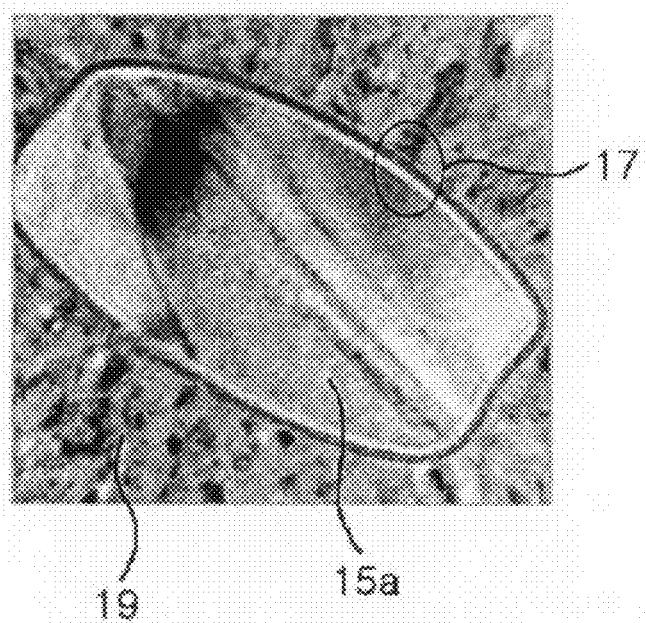

FIGS. 4A and 4B are transmission electron microscope (TEM) pictures illustrating a section of the nonvolatile memory transistor formed using the method described with reference to FIGS. 1A-1E, according to example embodiments. FIG. 4B is a partially enlarged view of FIG. 4A. Referring to FIGS. 4A and 4B, the poly-silicon fin 15a may be formed in the shape of a pole. The poly-silicon fin 15a may be surrounded by the charge trapping pattern 17, which is an ON layer, and the charge trapping pattern 17 may be surrounded by the control gate line 19, which is a poly-silicon layer.

Figure 5A:
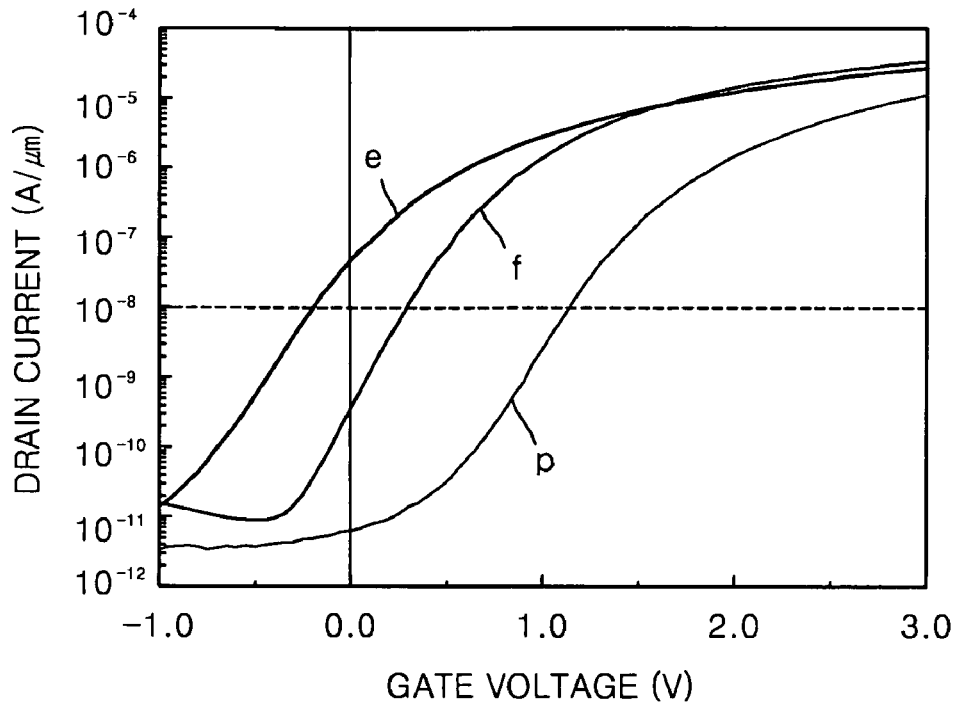
FIGS. 5A and 5B are graphs respectively illustrating Id-Vg curves of the nonvolatile memory transistor according to example embodiments and a conventional nonvolatile memory transistor having a planar poly-silicon layer as a channel layer.
Figure 5B:
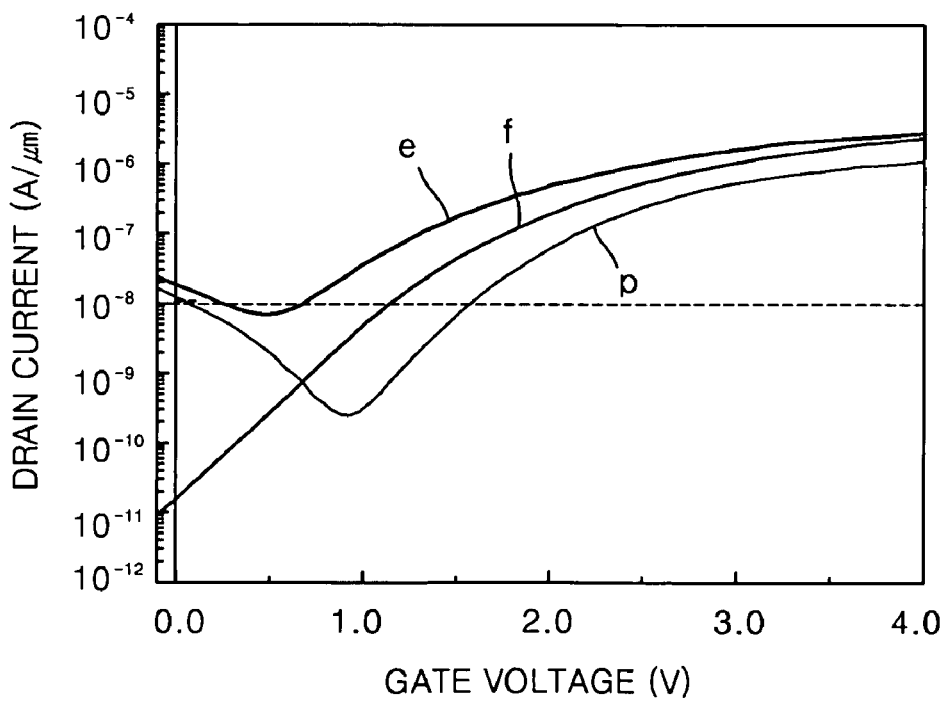

FIGS. 5A and 5B are graphs respectively illustrating Id-Vg curves of the nonvolatile memory transistor formed using the method described with reference to FIG. 1A-1E and a conventional nonvolatile memory transistor having a planar poly-silicon layer as a channel layer. Referring to FIGS. 5A and 5B, the nonvolatile memory transistor having a poly-silicon fin 15a according to example embodiments illustrated in FIGS. 5A-5B may have a lower leakage current (e.g., off current) and a higher operation current (e.g., on current) than the conventional nonvolatile memory transistor having a planar poly-silicon layer as a channel layer. This phenomenon may be respectively seen in all the fresh, programmed and erased states f, p and e.

Figure 6:
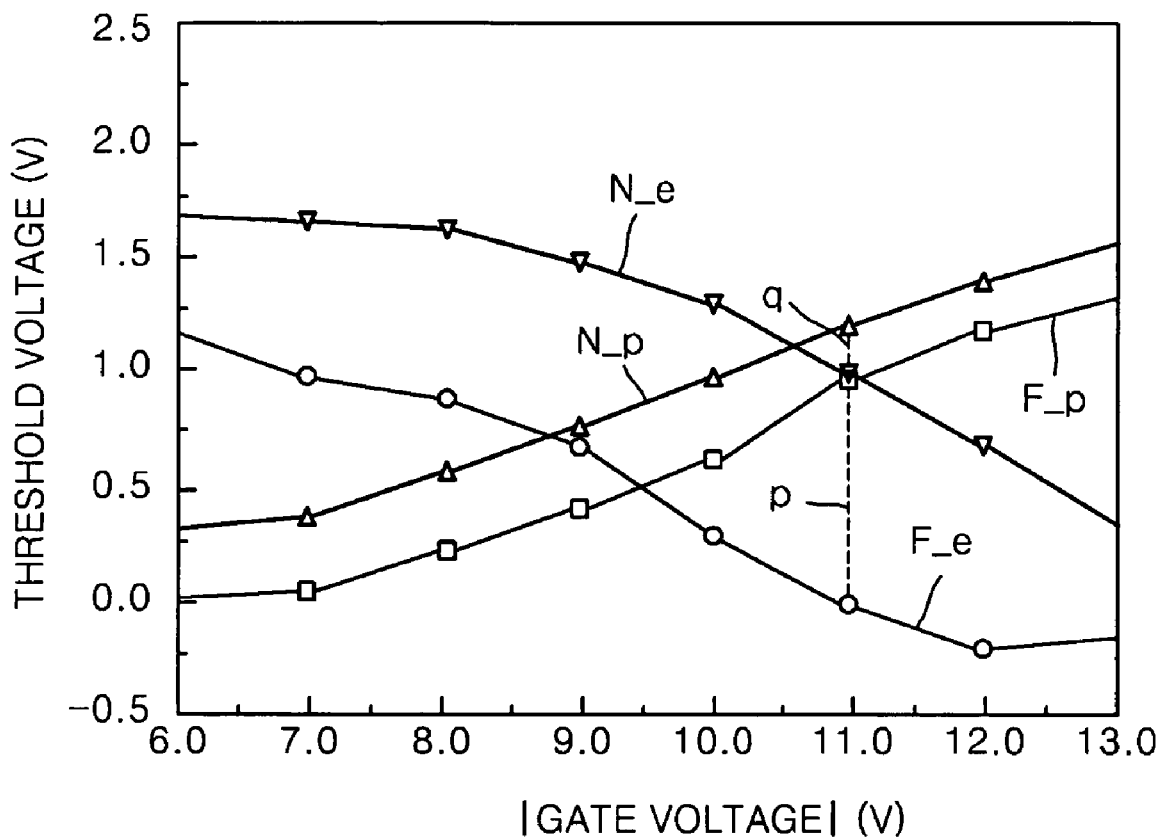

FIG. 6 is a graph illustrating a program/erase window of the nonvolatile memory transistor according to example embodiments and the conventional nonvolatile memory transistor having a planar poly-silicon layer as a channel layer. The horizontal axis indicates an absolute value of a gate voltage, and the vertical axis indicates a threshold voltage. Referring to FIG. 6, when the absolute value of a gate voltage is about 11V, the difference p of threshold voltages between programmed and erased states F_p and F_e of the nonvolatile memory transistor according to example embodiments may be about 1.41V. On the other hand, the difference q of threshold voltages between programmed and erased states N_p and N_e of the conventional nonvolatile memory transistor having a planar poly-silicon layer as a channel layer may be about 0.25V. Accordingly, the nonvolatile memory transistor according to example embodiments may have a program/erase window broader than the conventional nonvolatile memory transistor.

FIG. 7 is a layout of a unit device layer provided in a stacked nonvolatile memory device, according to example embodiments. FIGS. 8A through 8I are cross-sectional views taken along line A-A in FIG. 7, and FIGS. 9A through 9I are cross-sectional views taken along line B-B in FIG. 7. First, a stacked nonvolatile memory device according to example embodiments will be described with reference to FIGS. 7, 8I and 9I.

A plurality of active fins 100a protruding upward from a semiconductor substrate 100 may be defined by trenches 100b (FIG. 8A) formed in the semiconductor substrate 100, and the active fins 100a may have the shape of lines extending parallel with one another in a first direction Y. A device isolation layer 107 may be positioned in lower regions of the trenches 100b, and upper regions of the active fins 100a may be exposed above the device isolation layer 107.

A plurality of first control gate lines 119c may intersect over the active fins 100a in a second direction X. A plurality of first charge storing patterns 117' may be positioned between the first control gate lines 119c and the active fins 100a at intersection regions of the first control gate lines 119c and the active fins 100a, respectively. Each of the first charge storing patterns 117' may be on or cover the top surface and sidewalls of each of the active fins 100a.

A first ground selection line 119g and a first string selection line 119s, intersecting over the active fins 100a in the second direction X, may be respectively positioned at both sides of the plurality of first control gate lines 119c. The plurality of first charge storing patterns 117' may also be positioned between the active fins 100a and the first ground and string selection lines 119g and 119s at intersection regions of the active fins 100a and the first ground and string selection lines 119g and 119s, respectively.

The plurality of first charge storing patterns 117' may be first floating gates. In example embodiments, a first gate insulating layer 116 may be interposed between the plurality of first charge storing patterns 117' and the active fins 100a. A first inter-gate dielectric layer 118 may be interposed between the plurality of first charge storing patterns 117' and the first control gate lines 119c, and between the plurality of first charge storing patterns 117' and the first ground and string selection lines 119g and 119s. The plurality of first charge storing patterns 117' may also be a poly-silicon layer. Each of the first control gate lines 119c and the first ground and string selection lines 119g and 119s may be a poly-silicon layer or a stacked layer including a poly-silicon layer and a metal silicide layer that may be a W, Co or Ni silicide layer.

Impurity regions 101_a, 101_b and 101_c may be formed in the active fins 100a in the regions of the active fins 100a that are exposed between the first control gate lines 119 and the first ground and string selection lines 119g and 119s. As a result, a plurality of first strings including first string selection transistors, first cell transistors and first ground selection transistors, connected in series to one another, may be formed, and the first strings may constitute a first unit device layer $U_1$.

The impurity regions 101_c, which are formed in the active fins 100a, adjacent to the first string selection line 119s and positioned opposite to the first control gate lines 119c, may define drain regions of the first string selection transistors. The impurity regions 101_b, which are formed in the active fins 100a, adjacent to the first ground selection line 119g and positioned opposite to the first control gate lines 119c, may define source regions of the first ground selection transistors.

A first interlayer dielectric layer 120 may be formed on the first control gate lines 119c and the first ground and string selection lines 119g and 119s, and a plurality of first poly-silicon fins 135a may then be formed on the first interlayer dielectric layer 120. The first poly-silicon fins 135a may have the shape of lines extending parallel with one another in the first direction Y, and the first poly-silicon fins 135a may be formed by crystallizing amorphous silicon patterns using an excimer laser annealing (ELA) method.

A plurality of second control gate lines 139c may intersect over the first poly-silicon fins 135a in the second direction X, and the plurality of second charge storing patterns 137' may be positioned between the second control gate lines 139c and the first poly-silicon fins 135a at intersection regions of the second control gate lines 139c and the first poly-silicon fins 135a, respectively. Thus, each of the second charge storing patterns 137' may be on or cover the top surface and sidewalls of the first poly-silicon fins 135a.

A second ground selection line 139g and a second string selection line 139s, intersecting over the first poly-silicon fins 135a in the second direction X, may be respectively positioned at both sides of the plurality of second control gate lines 139c. The plurality of second charge storing patterns 137' may also be positioned between the first poly-silicon fins 135a and the second ground and string selection lines 139g and 139s at intersection regions of the first poly-silicon fins 135a and the second ground and string selection lines 139g and 139s, respectively.

The first interlayer dielectric layer 120 may have a first supporting portion 125a positioned beneath the first poly-silicon fin 135a. Because the width W_125a of the first supporting portion 125a is narrower than the width W_135a of the first poly-silicon fin 135a, a bottom surface of the first poly-silicon fin 135a may be exposed surrounding the first supporting portion 125a. The second charge storing pattern 137' may be on or cover the exposed bottom surface of the first poly-silicon fin 135a. The first interlayer dielectric layer 120 may include a lower interlayer dielectric layer 121 and a first protective layer 123, sequentially stacked and positioned beneath the first supporting portion 125a.

The second charge storing patterns 137' may be second floating gates, and a second gate insulating layer 136 may be interposed between the second charge storing patterns 137' and the first poly-silicon fins 135a. A second inter-gate dielectric layer 138 may be interposed between the second charge storing patterns 137' and the second control gate lines 139c, and between the second charge storing patterns 137' and the second ground and string selection lines 139g and 139s.

Impurity regions 135_a, 135_b and 135_c may be formed in the first poly-silicon fins 135a in the regions of the first poly-silicon fins 135a that are exposed between the second control gate lines 139c and the second ground and string selection lines 139g and 139s. As a result, a plurality of second strings including second string selection transistors, second cell transistors and second ground selection transistors, connected in series to one another, may be formed. The second strings constitute a second unit device layer $U_2$.

The impurity regions 135_c formed in the first poly-silicon fins 135a, adjacent to the second string selection line 139s and positioned opposite to the second control gate lines 139c, define drain regions of the second string selection transistors. The impurity regions 135_b formed in the first poly-silicon fins 135a, adjacent to the second ground selection line 139g and positioned opposite to the second control gate lines 139c, define source regions of the second ground selection transistors.

A second interlayer dielectric layer 140 may be formed on the second control gate lines 139c and the second ground and string selection lines 139g and 139s. A plurality of second poly-silicon fins 155a may be formed on the second interlayer dielectric layer 140, and the second poly-silicon fins 155a may be lines extending parallel to one another in the first direction Y. The second poly-silicon fins 155a may be formed by crystallizing amorphous silicon patterns using an excimer laser annealing method.

A plurality of third control gate lines 159c may intersect over the second poly-silicon fins 155a in the second direction X. Third charge storing patterns 157' may be positioned between the third control gate lines 159c and the second poly-silicon fins 155a at intersection regions of the third control gate lines 159c and the second poly-silicon fins 155a, respectively. Each of the third charge storing patterns 157' may be on or cover the top surface and sidewalls of the second poly-silicon fins 155a.

A third ground selection line 159g and a third string selection line 159s, intersecting over the second poly-silicon fins 155a in the second direction X, may be respectively positioned at both sides of the plurality of third control gate lines 159c. The third charge storing patterns 157' may also be positioned between the second poly-silicon fins 155a and the third ground and string selection lines 159g and 159s at intersection regions of the second poly-silicon fins 155a and the third ground and string selection lines 159g and 159s, respectively.

The second interlayer dielectric layer 140 may have a second supporting part 145a positioned beneath the second poly-silicon fin 155a. Because the width W_145a of the second supporting portion 145a is narrower than the width W_155a of the second poly-silicon fin 155a, a bottom surface of the second poly-silicon fin 155a may be exposed surrounding the second supporting portion 145a. The third charge storing pattern 157' may be on or cover the exposed bottom surface of the second poly-silicon fin 155a. The second interlayer dielectric layer 140 may include a second lower interlayer dielectric layer 141 and a second protective layer 143, sequentially stacked and positioned beneath the second supporting portion 145a.

The third charge storing patterns 157' may be third floating gates, and a third gate insulating layer 156 may be interposed between the third charge storing patterns 157' and the second poly-silicon fins 155a. A third inter-gate dielectric layer 158 may be interposed between the third charge storing patterns 157' and the third control gate line 159c, and between the third charge storing patterns 157' and the third ground and string selection lines 159g and 159s.

Impurity regions 155_a, 155_b and 155_c may be formed in the second poly-silicon fins 155a in the regions of the second poly-silicon fins 155a that are exposed between the third control gate lines 159c and the third ground and string lines 159g and 159s. As a result, a plurality of third strings including third string selection transistors, third cell transistors and third ground selection transistors, connected in series to one another, may be formed. The third strings may constitute a third unit device layer $U_3$.

The impurity regions 155_c formed in the second poly-silicon fins 155a, adjacent to the third string selection line 159s and positioned opposite to the third control gate lines 159c, define drain regions of the third string selection transistors. The impurity regions 155_b formed in the second poly-silicon fins 155a, adjacent to the third ground selection line 159g and positioned opposite to the third control gate lines 159c, define source regions of the third ground selection transistors. A third interlayer dielectric layer 161 may be formed on the third control gate lines 159c and the third ground and string selection lines 159g and 159s.

First through source electrodes 127_CS, electrically connected to top surfaces of the source regions 101_b of the first ground selection transistors and bottom surfaces of the source regions 135_b of the second ground selection transistors, may be positioned in the first interlayer dielectric layer 120. First through bit-line electrodes 127_BL, electrically connected to top surfaces of the drain regions 101_c of the first string selection transistors and bottom surfaces of the source regions 135_c of the second string selection transistors, may also be positioned in the first interlayer dielectric layer 120.

Second through source electrodes 147_CS, electrically connected to top surfaces of the source regions 135_b of the second ground selection transistors and bottom surfaces of the source regions 155_b of the third ground selection transistors, may be positioned in the second interlayer dielectric layer 140. Second through bit-line electrodes 147_BL, electrically connected to top surfaces of the drain regions 135_c of the second string selection transistors and bottom surfaces of the drain regions 155_c of the third string selection transistors, may also be positioned in the second interlayer dielectric layer 140.

Third through source electrodes 167_CS, electrically connected to top surfaces of the source regions 155_b of the third ground selection transistors, may be positioned in the third interlayer dielectric layer 161. Third through bit-line electrode 167_BL, electrically connected to top surfaces of the source regions 155_c of the third string selection transistors, may also be positioned in the third interlayer dielectric layer 161.

Bit lines (not shown) may be electrically connected to the third through bit-line electrodes 167_BL, respectively, and source lines (not shown) may be electrically connected to the third through source electrodes 167_CS, respectively. Thus, first through third strings may be connected parallel to each other between a pair of bit and source lines. As a result, the nonvolatile memory device according to example embodiments may accomplish an integration degree three times higher than a nonvolatile memory device having a single unit device layer. In example embodiments, the device including three unit device layers is described. However, example embodiments may not be limited thereto and may be applied to a device including a plurality of unit device layers. Hereinafter, a method of fabricating a stacked nonvolatile memory device according to example embodiments will be described.

Figure 8A:
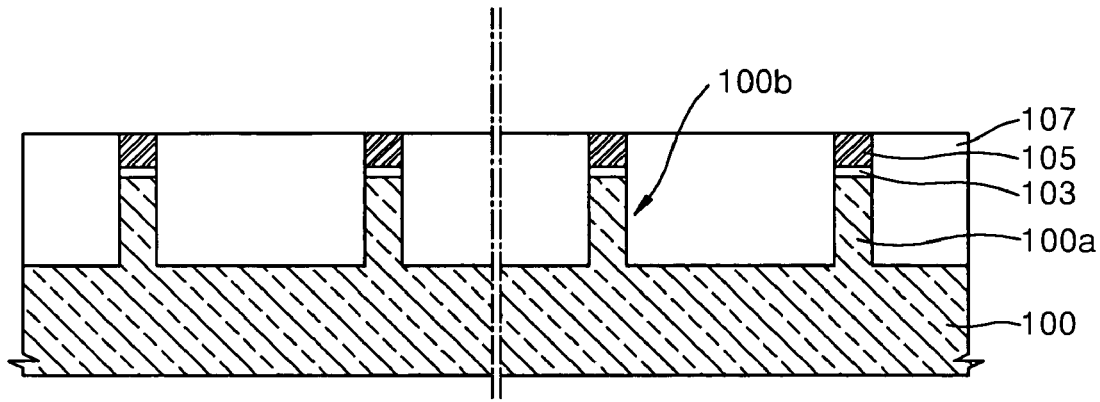
FIGS. 8A-8I are cross-sectional views taken along line A-A in FIG. 7, and FIGS. 9A-9I are cross-sectional views taken along line B-B in FIG. 7.
Figure 9A:
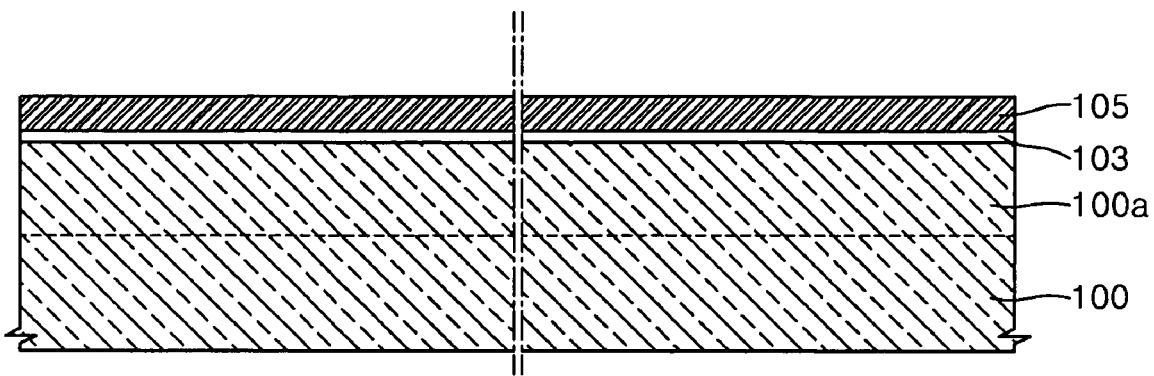

Referring to FIGS. 7, 8A and 9A, a sacrificial insulating layer 103 and a hard mask layer 105 may be sequentially stacked on a semiconductor substrate 100. A photoresist pattern (not shown) may be formed on the hard mask layer 105, and the hard mask layer 105, the sacrificial layer 103 and the semiconductor substrate 100 may then be etched using the photoresist pattern as a mask. As a result, trenches 100b, which define a plurality of active fins 100a, may be formed in the semiconductor substrate 100. Thereafter, the photoresist pattern may be removed, and the active fins 100a may be lines extending parallel to one another in the first direction Y. Subsequently, a device isolation layer 107 may be formed in the trenches 100b and on the hard mask layer 105, and then planarized until the hard mask layer 105 is exposed.

Figure 8B:
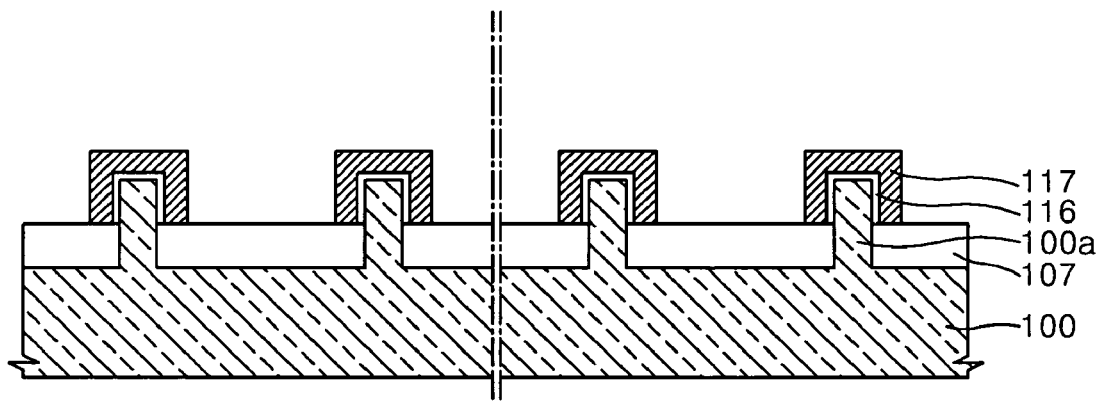
Figure 9B:
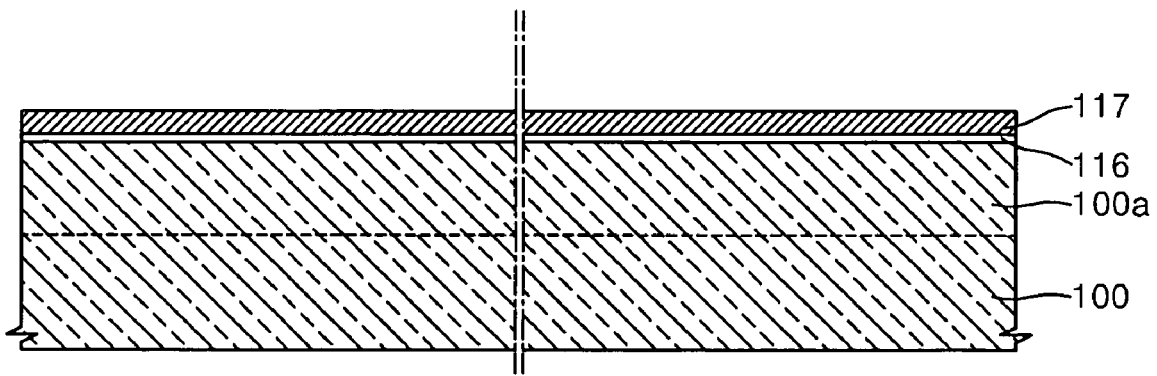

Referring to FIGS. 7, 8B and 9B, the device isolation layer 107 may be etched back, and thus, the device isolation layer 107 may remain in a lower region of the trenches 100b. As a result, upper regions of the active fins 100a may be exposed above the device isolation layer 107. A first charge storing layer may be formed on the entire surface of the semiconductor substrate 100 having the exposed active fins 100a. In example embodiments, the first charge storing layer may be a first floating gate conductive layer, and as such, before forming the first floating gate conductive layer, a first gate insulating layer 116 may be formed on the entire surface of the semiconductor substrate 100 having the exposed active fins 100a by using a thermal oxidation method. Thereafter, the first charge storing layer may be patterned using a photolithography method, thereby forming first preliminary charge storing patterns 117 having the shape of lines extending along the respective active fins 100a.

Figure 8C:
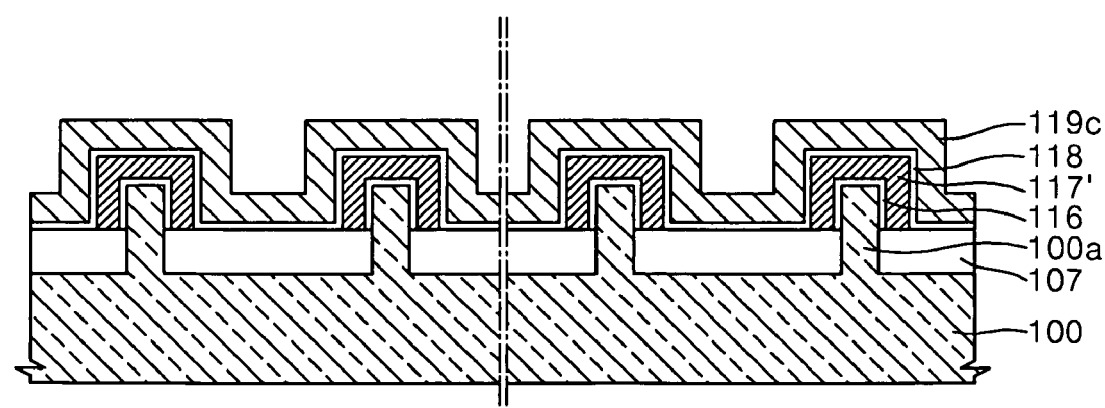
Figure 9C:
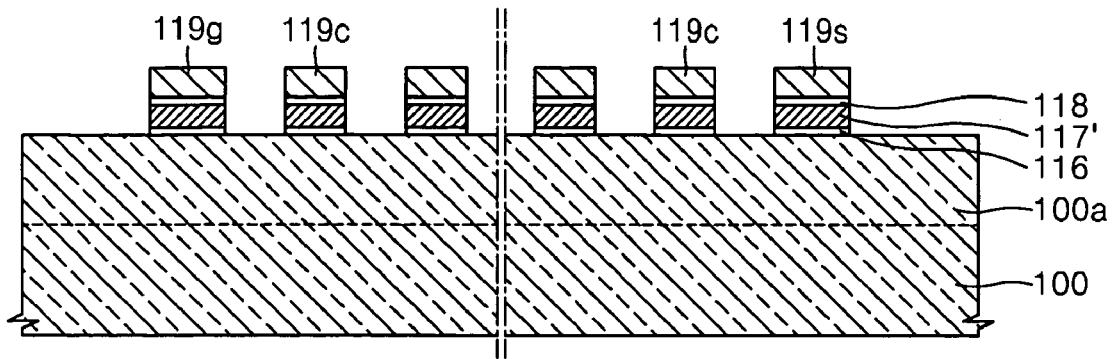

Referring to FIGS. 7, 8C and 9C, an inter-gate dielectric layer 118 and a gate conductive layer (not shown) may be sequentially stacked on the first preliminary charge storing pattern 117. After that, the gate conductive layer, the inter-gate dielectric layer 118 and the first preliminary charge storing pattern 117 may be sequentially patterned. As a result, a plurality of first control gate lines 119c intersecting over the active fins 100a in the second direction X may be formed, and a first ground selection line 119g and a first string selection line 119s, intersecting over the active fins 100a in the second direction X, may be respectively positioned at both sides of the plurality of first control gate lines 119c. First charge storing patterns 117' may be respectively formed between the first control gate lines 119c and the active fins 100a, and between the active fins 100a and the first ground and string selection lines 119g and 119s.

Then, n-type or p-type impurities may be implanted into the active fins 100a using the first control gate lines 119c and the first ground and string selection lines 119g and 119s as a mask. As a result, impurity regions 101_a, 101_b and 101_c may be formed in the active fins 100a. A plurality of first strings including first string selection transistors, first cell transistors and first ground selection transistors, connected in series with one another, may be formed, and the first strings may constitute a first unit device layer $U_1$.

The impurity regions 101_c formed in the active fins 100a, adjacent to the first string selection line 119s and positioned opposite to the first control gate lines 119c, define drain regions of the first string selection transistors. The impurity regions 101_b formed in the active fins 100a, adjacent to the first ground selection line 119g and positioned opposite to the first control gate lines 119c, define source regions of the first ground selection transistors.

Figure 8D:
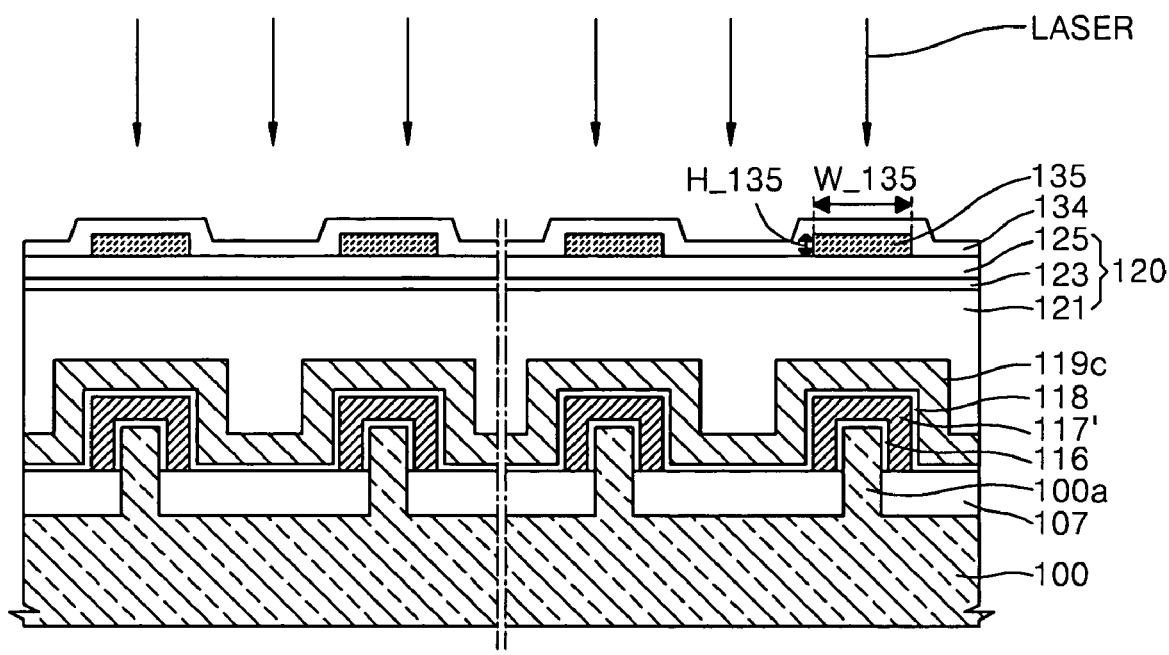
Figure 9D:
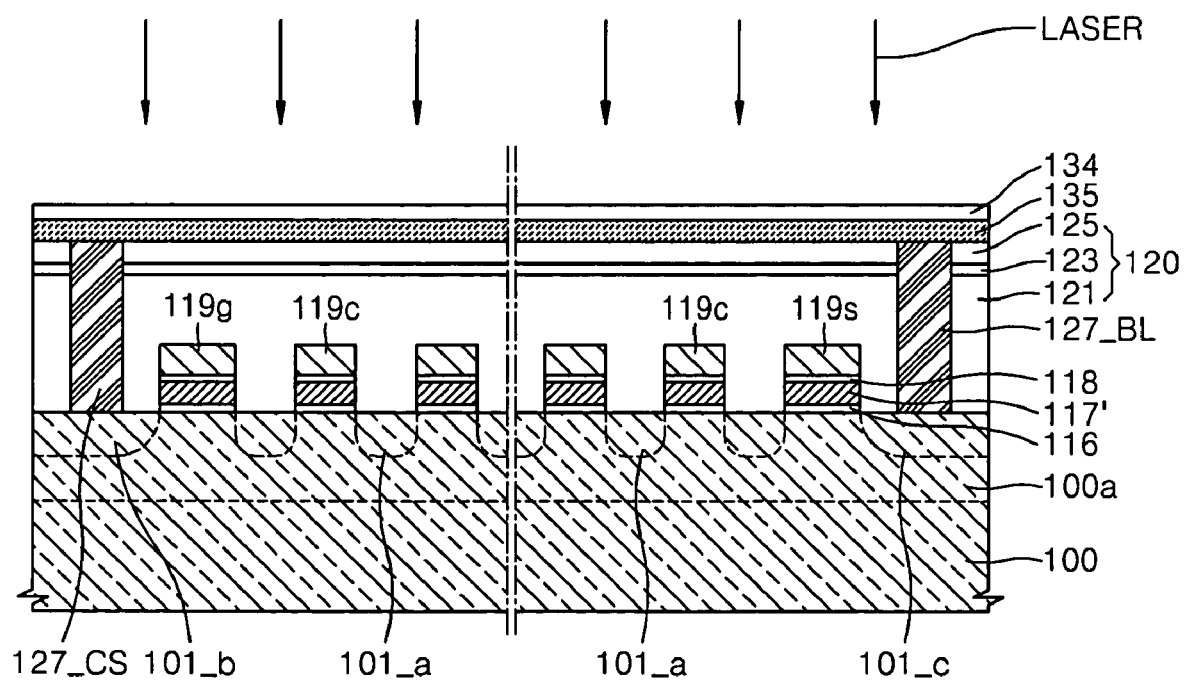

Referring to FIGS. 7, 8D and 9D, a first interlayer dielectric layer 120 may be formed on the first control gate lines 119c and the first ground and string selection lines 119g and 119s, and the first interlayer dielectric layer 120 may include a lower interlayer dielectric layer 121, a first protective layer 123 and a first buffer layer 125, sequentially stacked.

Contact holes, for respectively, exposing the drain regions 101_c of the first string selection transistors and the source regions 101_b of the first ground selection transistors, may be formed in the first interlayer dielectric layer 120. A conductive layer may be stacked on the semiconductor substrate 100 having the contact holes, and a chemical mechanical polishing (CMP) process may then be performed on the conductive layer. As a result, first through bit-line electrodes 127_BL and first through source electrodes 127_CS, electrically connected respectively to the drain regions 101_c of the first string selection transistors and the source regions 101_b of the first ground selection transistors, may be formed in the first interlayer dielectric layer 120.

Amorphous silicon patterns 135 may be formed on the first interlayer dielectric layer 120 using a photolithography method, and the amorphous silicon patterns 135 may be lines extending parallel with one another in the first direction Y. The amorphous silicon patterns 135 may be aligned with the active fins 100a. A capping layer 134 may be formed on the semiconductor substrate 100 having the amorphous silicon patterns 135, so that the capping layer 134 is on or covers the amorphous silicon patterns 135. The capping layer 134 may be a silicon oxide layer through which an excimer laser beam, as described later, may be easily transmitted, and the thickness of the capping layer 134 may be about 5 nm to about 2000 nm. Subsequently, an excimer laser beam may be irradiated on the capping layer 134, so that the excimer laser beam may be transmitted through the capping layer 134 and then absorbed into the amorphous silicon pattern 135. The intensity of the excimer laser beam may be about 100 to about 2,000 mJ/cm$^2$.

Figure 8E:
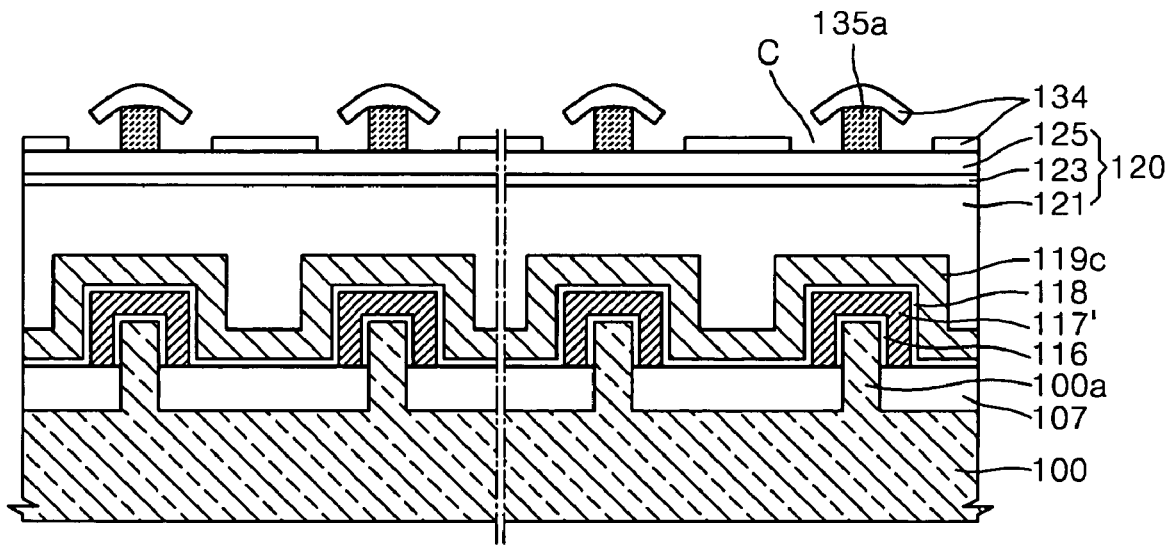
Figure 9E:
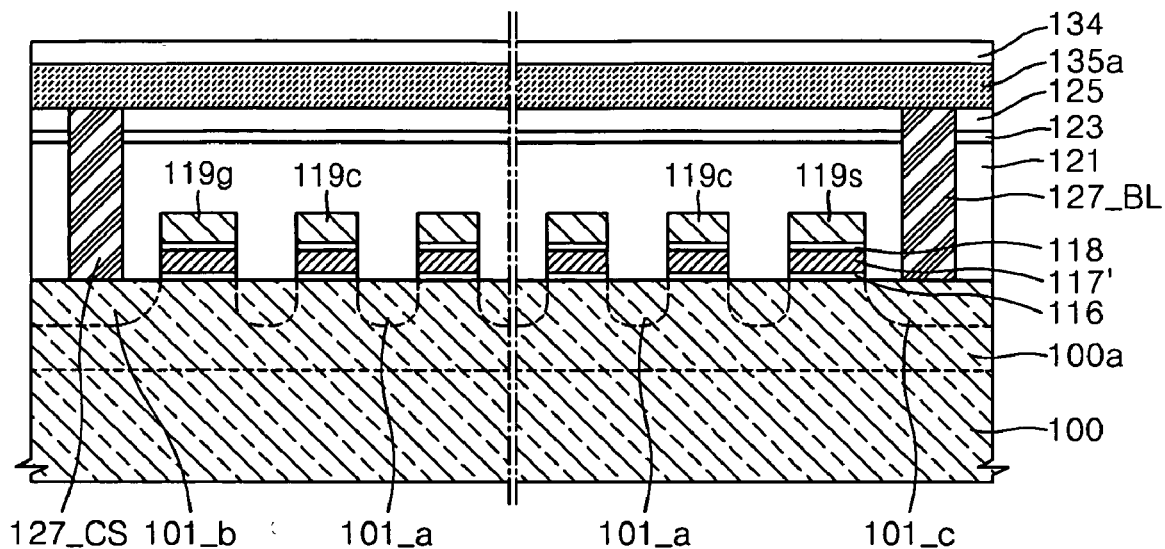

Referring to FIGS. 7, 8E, and 9E, the amorphous silicon patterns 135, which absorb the excimer laser beam, may be melted and crystallized, thereby forming first poly-silicon fins 135a having the shape of a pole. The detailed description by which the first poly-silicon fins 135a are formed is substantially the same as that of the description about the poly-silicon fins 15a of FIG. 1C. In the crystallization process, a crack C may be produced at a step difference portion of the capping layer 134.

Figure 8F:
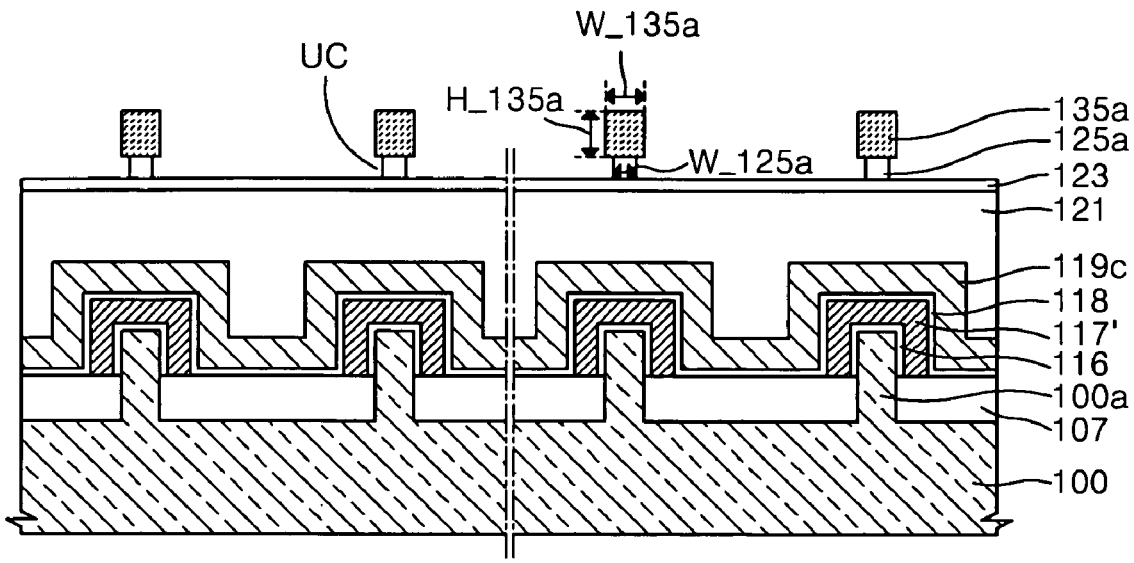
Figure 9F:
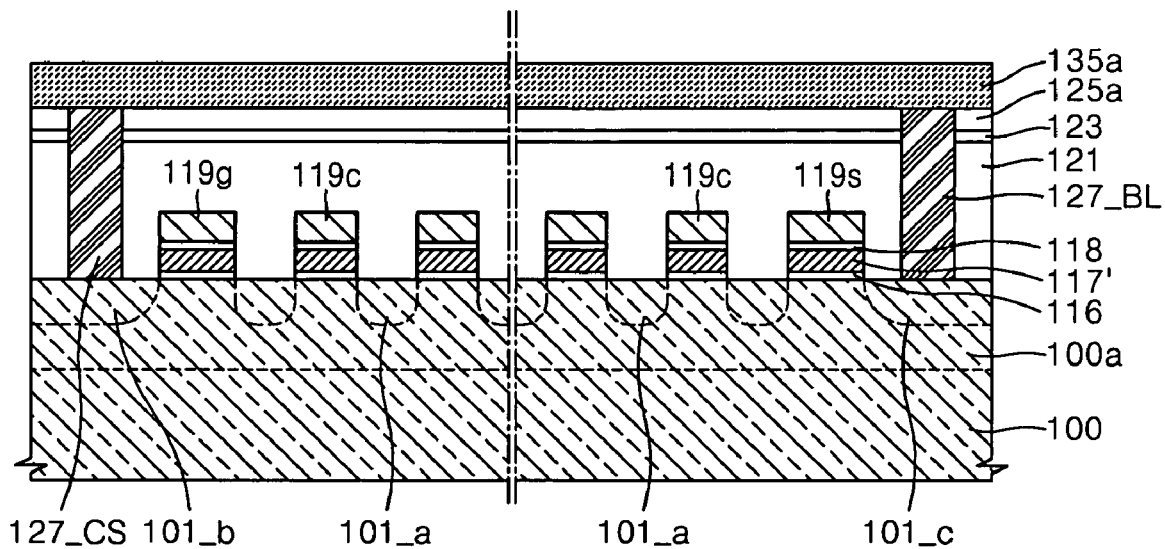

Referring to FIGS. 7, 8F, and 9F, the first poly-silicon fins 135a having the shape of a pole may be exposed by removing the capping layer 134. Thus, the width W_135a of the first poly-silicon fin 135a may be narrower than the width W_135 of the amorphous silicon pattern 135, and the height H_135a of the first poly-silicon fin 135a may be higher than the height H_135 of the amorphous silicon pattern 135. The height H_135a with respect to the width W_135a of the first poly-silicon fin 135s may be about 1 or more.

Thereafter, the first buffer layer 125 may be isotropically etched using the first protective layer 123 as an etch stop layer. As a result, an undercut UC may be formed beneath the first poly-silicon fin 135a, and a remaining portion of the isotropically etched first buffer layer 125 may form a first supporting portion 125a at the bottom surface of the first poly-silicon fin 135a. The first protective layer 123 may be exposed surrounding the bottom surface of the first supporting portion 125a. The width W_125a of the first supporting portion 125a may be narrower than the width W_135a of the first poly-silicon fin 135a. Thus, the bottom surface of the first poly-silicon fin 135a may be exposed surrounding a top surface of the first supporting portion 125a. Even if the first protective layer 123 is formed to allow the height of the first supporting portion 125a to be uniform throughout the semiconductor substrate 100, the first protective layer 123 may be omitted.

The isotropic etching may be wet etching or isotropic dry etching. When the capping layer 134 and the first buffer layer 125 are formed of the same material layer, the first buffer layer 125 may be simultaneously etched while removing the capping layer 134.

Figure 8G:
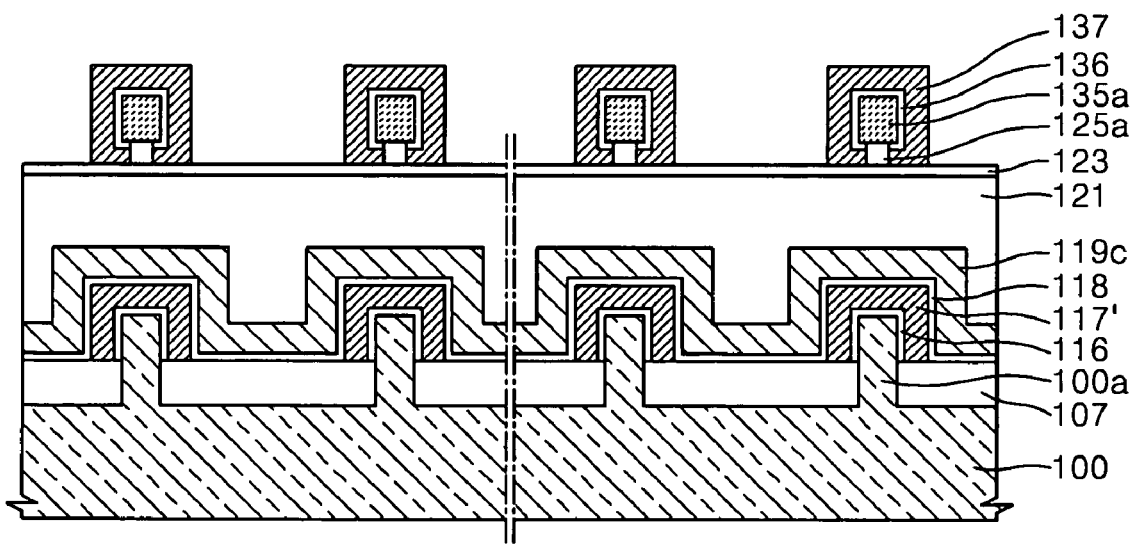
Figure 9G:
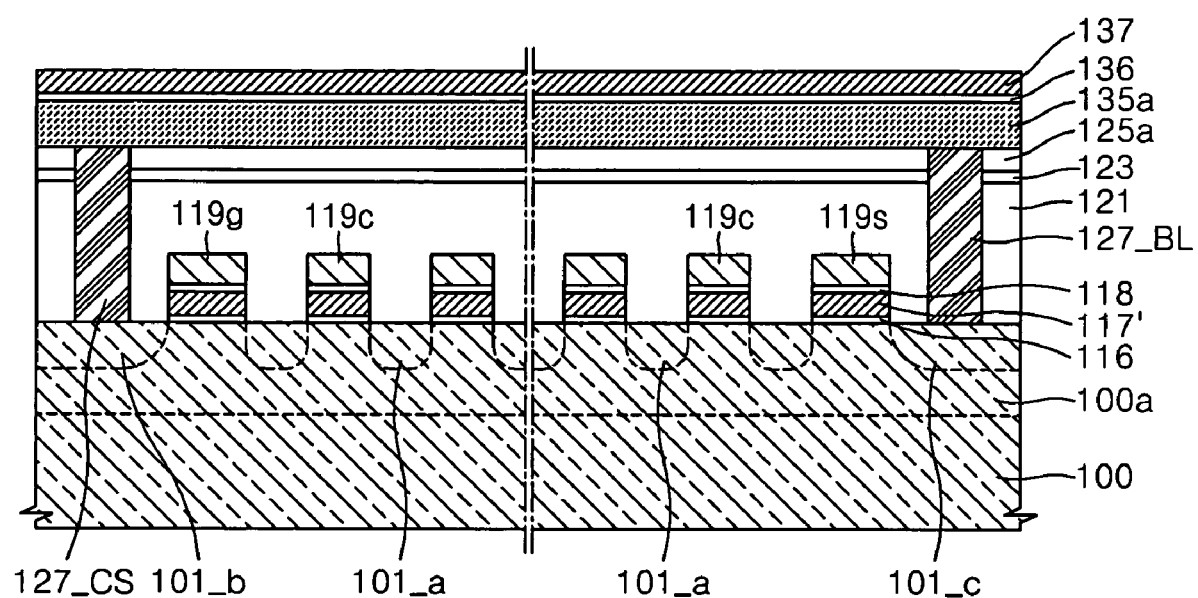

Referring to FIGS. 7, 8G and 9G, a second charge storing layer (not shown) may be formed on the top surface, sidewalls and bottom surface of the first poly-silicon fins 135a. When forming the first supporting portion 125a is omitted, the second charge storing layer (not shown) may be formed only on the top surface and sidewalls of the first poly-silicon fins 135a. The second charge storing layer (not shown) may be formed using LPCVD, PECVD, ICPCVD or ALD. For example, the second charge storing layer may be formed using PECVD, ICPCVD or ALD, in which a layer is formed at about 600° C. or less, or at a relatively low temperature. Accordingly, the deterioration of the device formed in the first device layer U1 may be prevented or reduced.

In example embodiments, the second charge storing layer may be a second floating gate conductive layer. Before forming the second floating conductive layer, a second gate insulating layer 136 may be formed on the entire surface of the semiconductor substrate 100 having the first poly-silicon fins 135a. The second gate insulating layer 136 may be formed using a thermal oxidation method, LPCVD, PECVD, ICPCVD or ALD. For example, the second gate insulating layer 136 may be formed using PECVD, ICPCVD or ALD, in which a layer is formed at about 600° C. or less, or at a relatively low temperature. Thereafter, the second charge storing layer may be patterned using a photolithography method, thereby forming a second preliminary charge storing patterns 137 having the shape of lines extending along the respective first poly-silicon fins 135a.

Figure 8H:
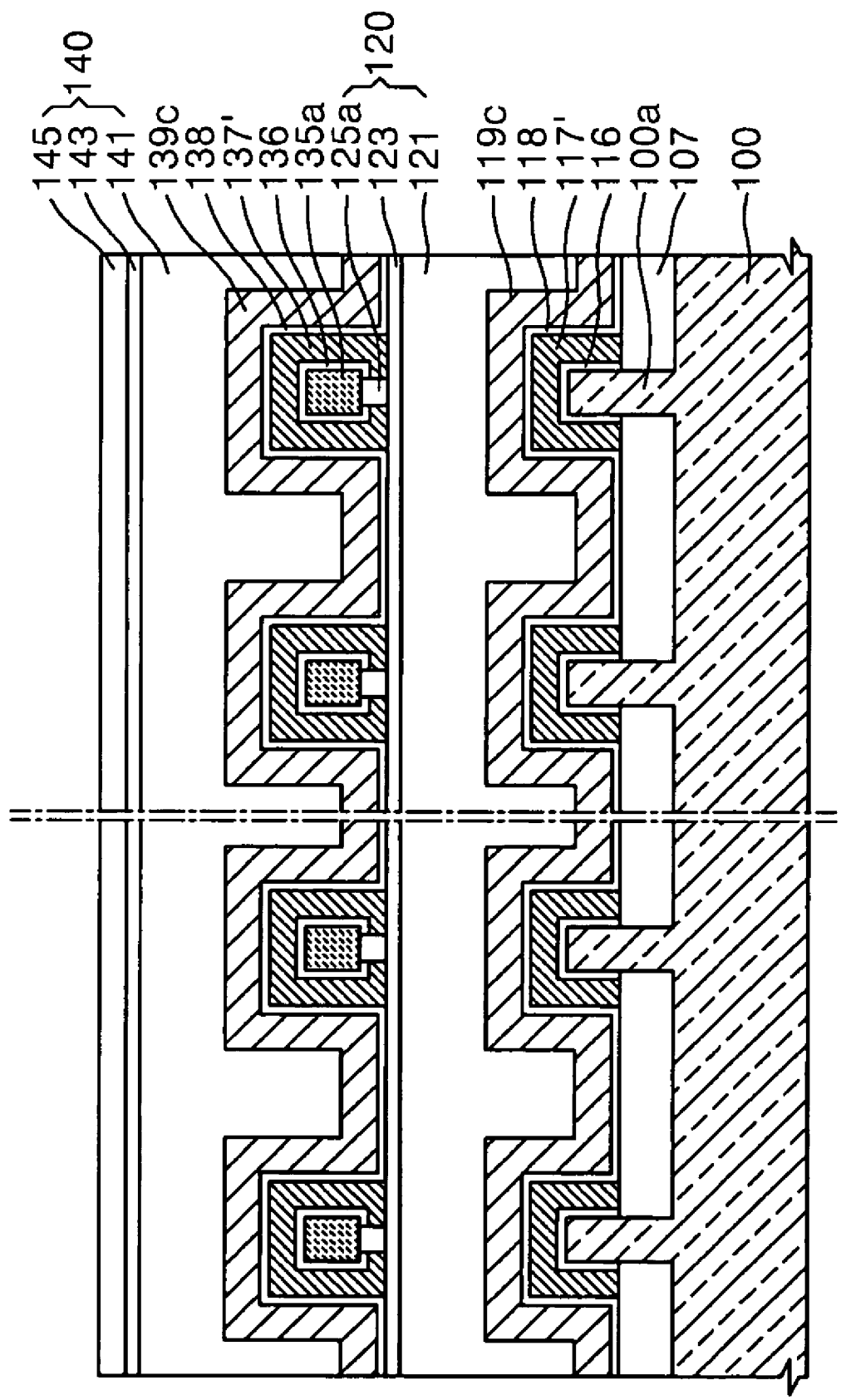

Referring to FIGS. 7, 8H and 9H, a second inter-gate dielectric layer 138 and a gate conductive layer (not shown) may be sequentially stacked on the second preliminary charge storing pattern 137. After that, the gate conductive layer, the second inter-gate dielectric layer 138 and the second preliminary charge storing pattern 137 may be sequentially patterned. As a result, a plurality of second control gate lines 139c intersecting over the first poly-silicon fins 135a in the second direction X may be formed. A second ground selection line 139g and a second string selection line 139s, intersecting over the first poly-silicon fins 135a in the second direction X, may be respectively positioned at both sides of the plurality of second control gate lines 139c. First charge storing patterns 137' may be respectively formed between the second control gate lines 139c and the first poly-silicon fins 135a, and between the first poly-silicon fins 135a and the second ground and string selection lines 139g and 139s.

Then, n-type or p-type impurities may be implanted into the first poly-silicon fins 135a using the second control gate lines 139c and the second ground and string selection lines 139g and 139s as a mask. As a result, impurity regions 135_a, 135_b and 135_c may be formed in the first poly-silicon fins 135a. Second strings including second string selection transistors, second cell transistors and second ground selection transistors, connected in series with one another, may be formed, and the second strings may constitute a second unit device layer U$_2$.

The impurity regions 135_c formed in the first poly-silicon fins 135a, adjacent to the second string selection line 139s and positioned opposite to the second control gate lines 139c, define drain regions of the second string selection transistors. The impurity regions 135_b formed in the first poly-silicon fins 135a, adjacent to the second ground selection line 139g and positioned opposite to the second control gate lines 139c, define source regions of the second ground selection transistors.

A second interlayer dielectric layer 140 may be formed on the second control gate lines 139c and the second ground and string selection lines 139g and 139s, and the second interlayer dielectric layer 140 may include a second lower insulating layer 141, a second protective layer 143 and the second buffer layer 145, sequentially stacked.

Contact holes (not shown), for respectively exposing the drain regions 135_c of the second string selection transistors and the source regions 135_b of the second ground selection transistors, may be formed in the second interlayer dielectric layer 140. A conductive layer may be stacked on the semiconductor substrate 100 having the contact holes, and a CMP process is then performed with respect to the conductive layer. As a result, second through bit-line electrodes 147_BL and second through source electrodes 147_CS, electrically connected respectively to the drain regions 135_c of the second string selection transistors and the source regions 135_b of the second ground selection transistors, are formed in the second interlayer dielectric layer 140.

Figure 8I:
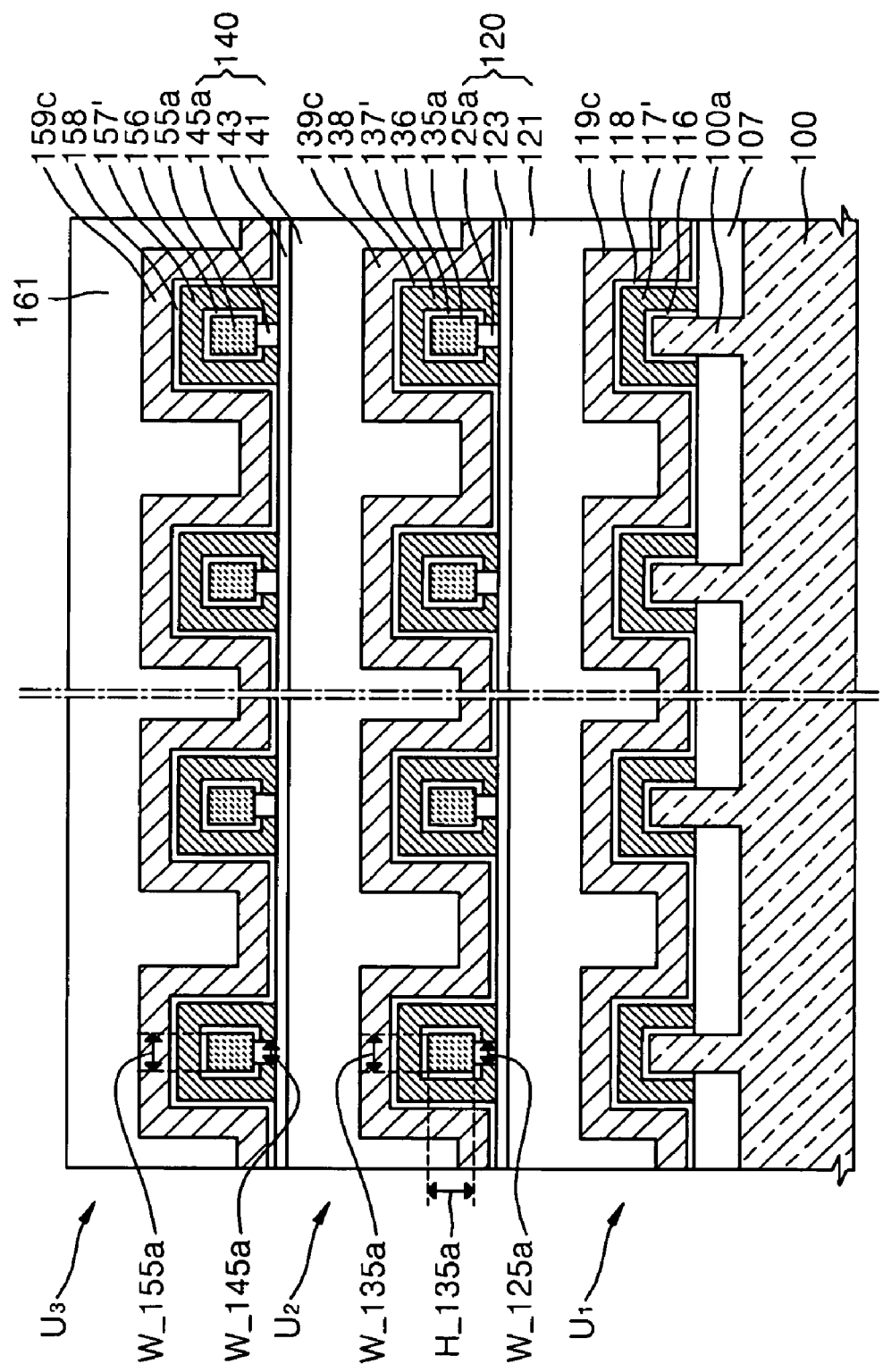
Figure 9I:
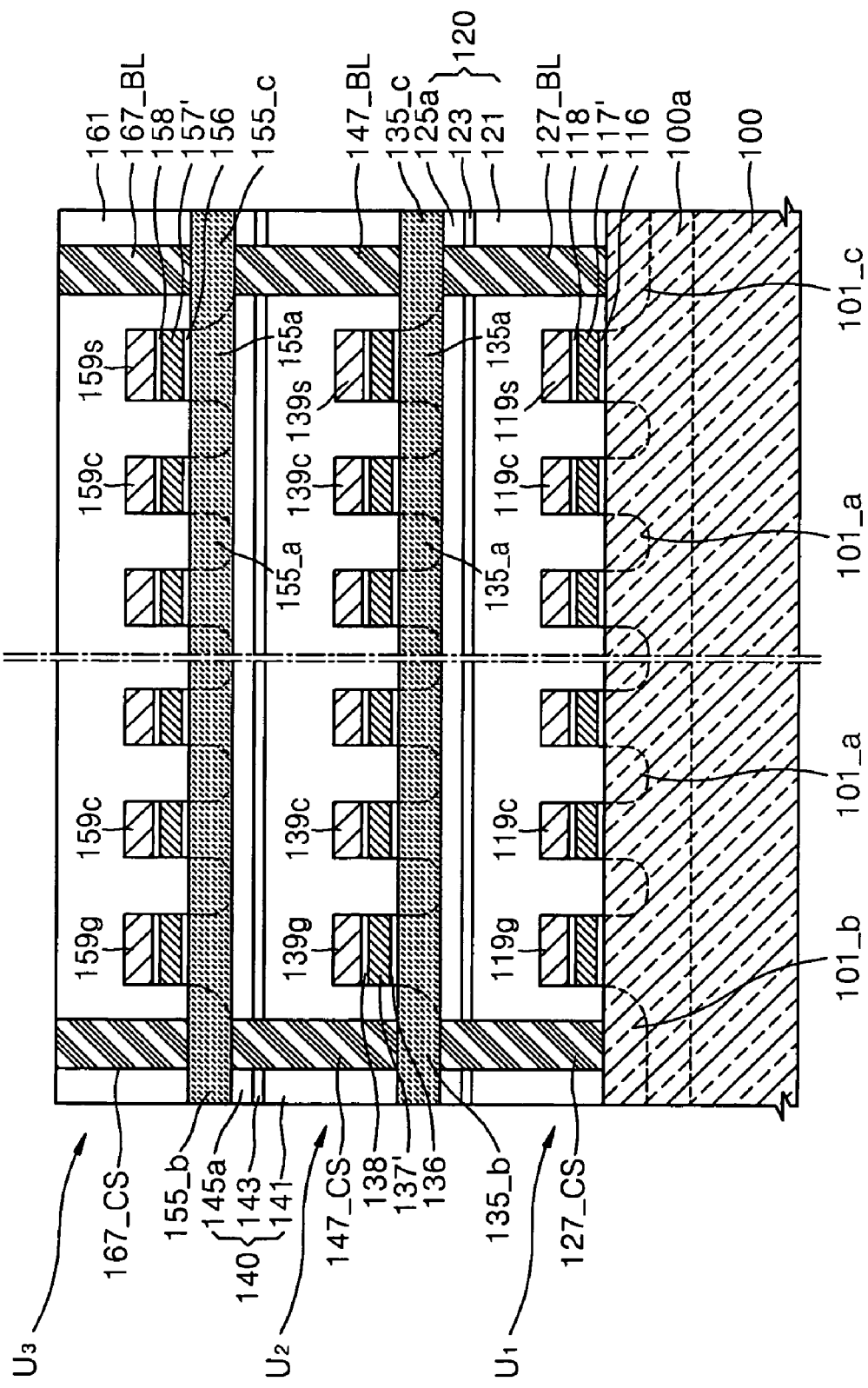

Referring to FIGS. 7, 8I and 9I, second poly-silicon fins 155a, second supporting portions 145a, a third gate insulating layer 156, third charge storing patterns 157', a third inter-gate dielectric layer 158, third control gate lines 159c, a third ground selection line 159g, a third string selection line 159s and impurity regions 155_a, 155_b and 155_c may be formed using a method similar to the method described with reference to FIGS. 8D-8H and 9D-9H. As a result, third strings including third string selection transistors, third cell transistors and third ground selection transistors, connected in series to one another, may be formed, and the third strings may constitute a third unit device layer $U_3$.

The impurity regions 155_c formed in the second poly-silicon fins 155a, adjacent to the third string selection line 159s and positioned opposite to the third control gate lines 159c, define drain regions of the second string selection transistors. The impurity regions 155_b formed in the second poly-silicon fins 155a, adjacent to the third ground selection line 159g and positioned opposite to the third control gate lines 159c, define source regions of the second ground selection transistors.

A third interlayer dielectric layer 161 may be formed on the third control gate lines 159c and the third ground and string selection lines 159g and 159s. A third through bit-line electrodes 167_BL and a third through source electrodes 167_CS, electrically connected respectively to the drain regions 155_c of the third string selection transistors and the source regions 155_b of the third ground selection transistors, may be formed in the third interlayer dielectric layer 161.

FIGS. 10A-10D are cross-sectional views sequentially illustrating some processes of a method of fabricating a stacked nonvolatile memory device according to example embodiments. The method of fabricating the transistor according to example embodiments may be similar to the fabrication method described with reference to FIGS. 8A-8I and 9A-9I, except of the following descriptions.

Figure 10A:
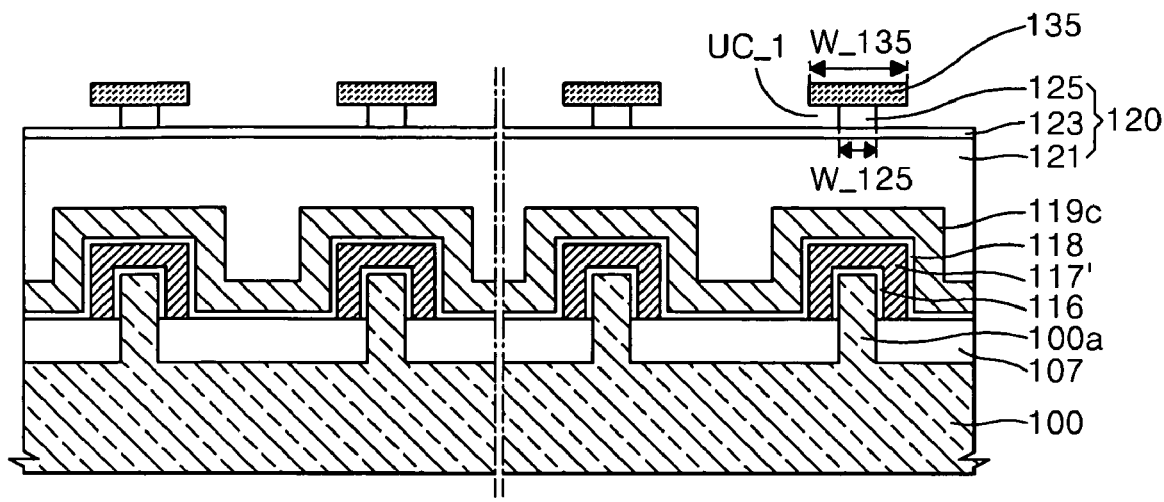
FIGS. 10A-10D are cross-sectional views sequentially illustrating some processes of a method of fabricating a stacked nonvolatile memory device according to example embodiments.

Referring to FIG. 10A, an interlayer dielectric layer 120 may be formed on a resultant structure described with reference to FIG. 7C. The interlayer dielectric layer 120 may include a lower interlayer dielectric layer 121, a protective layer 123 and a buffer layer 125. Amorphous silicon patterns 135 may be formed on the interlayer dielectric layer 120.

The buffer layer 125 may be etched using the amorphous silicon patterns 135 as a mask such that the width W_125 of the etched buffer layer 125 is identical to or narrower than the width W_135 of the amorphous silicon pattern 135. For example, the width W_125 of the etched buffer layer 125 may be about 0.1 times to about 1 time of the width W_135 of the amorphous silicon pattern 135. When the width W_125 of the etched buffer layer 125 is identical to the width W_135 of the amorphous silicon pattern 135, the buffer layer 125 may be etched using an anisotropic etching method. On the contrary, when the width W_125 of the etched buffer layer 125 is narrower than the width W_135 of the amorphous silicon pattern 135, the buffer layer 125 may be etched using an isotropic etching method. An undercut UC_1 may be formed beneath the amorphous silicon pattern 135.

Figure 10B:
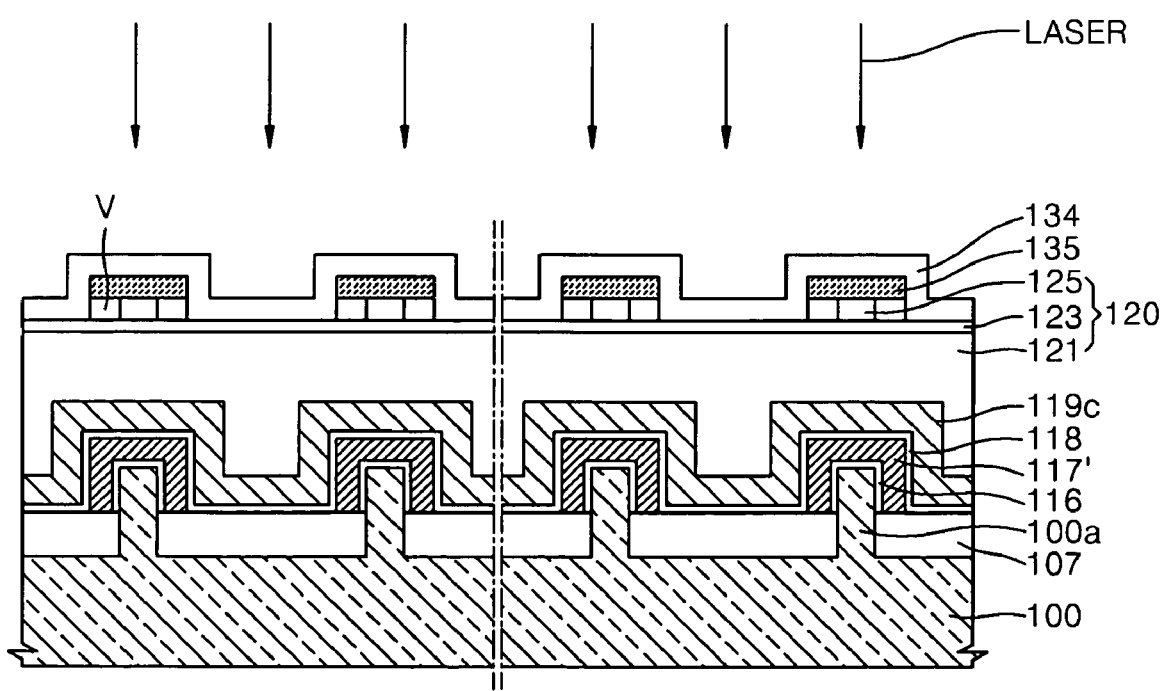

Referring to FIG. 10B, a capping layer 134 may be formed on a semiconductor substrate 100 having the amorphous silicon patterns 135. A vacancy V may be formed between the capping layer 134, the buffer layer 125 and the amorphous silicon pattern 135 by the undercut UC_1, and air may be filled in the vacancy V. Subsequently, an excimer laser beam may be irradiated onto the capping layer 134, and the excimer laser beam may be transmitted through the capping layer 134 and then absorbed into the amorphous silicon pattern 135.

Figure 10C:
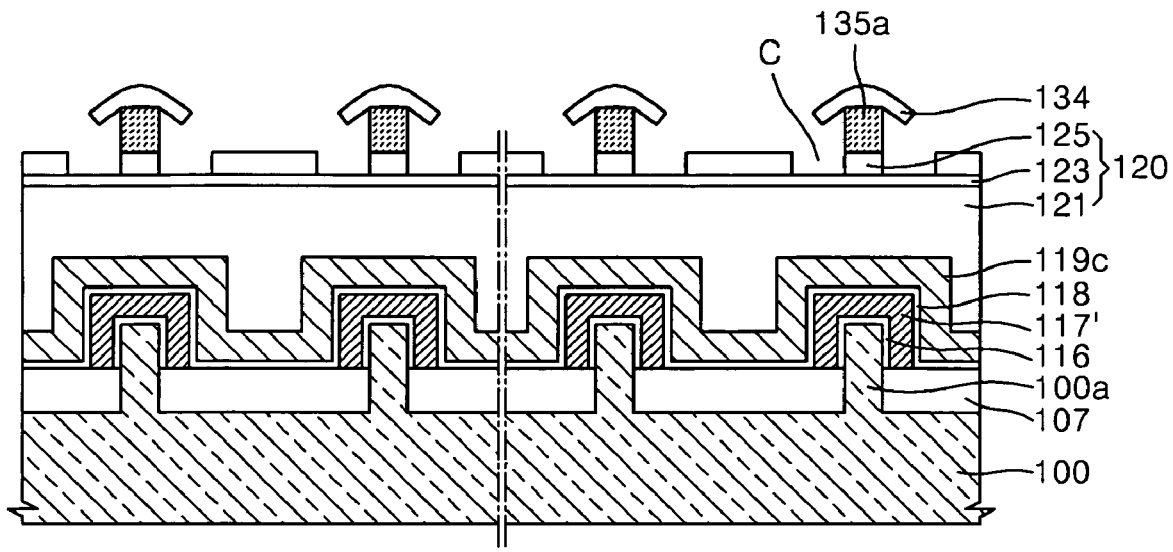

Referring to FIG. 10C, the amorphous silicon patterns 135 that absorb the excimer laser beam may be melted and crystallized, thereby forming poly-silicon fins 135a having the shape of a pole. The detailed description by which the poly-silicon fins 135a are formed is the same as the description of the poly-silicon fins 15a of FIG. 2C. The width of a bottom surface of the poly-silicon fin 135a may be identical to or narrower than the width W_125 of the buffer layer 125. In the crystallization process, a crack C may be produced at a step difference portion of the capping layer 134.

Figure 10D:
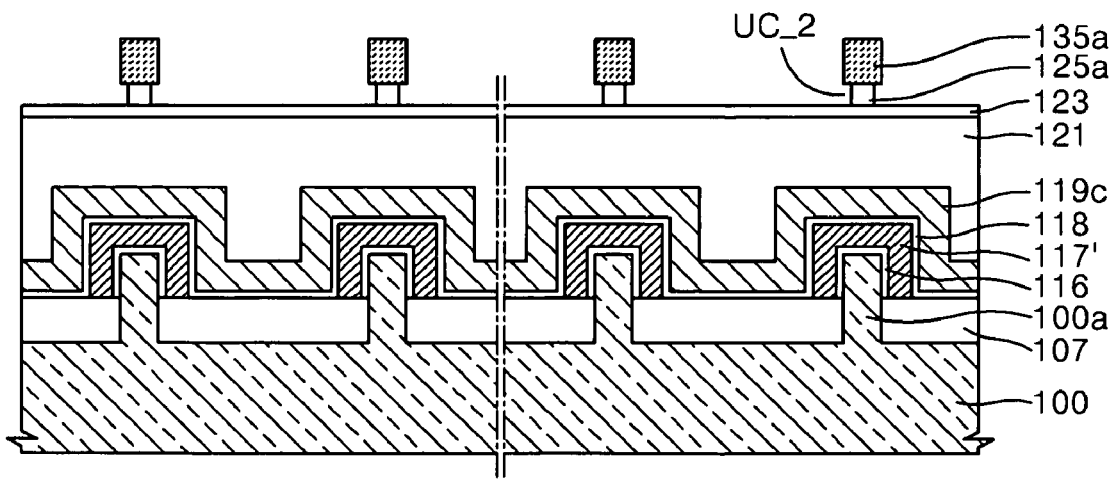

Referring to FIG. 10D, the poly-silicon fins 135a having the shape of a pole may be exposed by removing the capping layer 134, and the buffer layer 125 may be isotropically etched using the protective layer 123 as an etch stop layer. As a result, a portion of the buffer layer 125 positioned beneath the poly-silicon fin 135a may be etched, thereby forming an undercut UC_2 beneath the poly-silicon fin 135a. The remaining portion of the isotropically etched buffer layer 125 may form a supporting portion 125a beneath the poly-silicon fin 135a. When the capping layer 134 and the buffer layer 125 are formed of the same material layer, the buffer layer 125 may be simultaneously etched while removing the capping layer 134.

Thereafter, the stacked nonvolatile memory device may be fabricated using the method described with reference to FIGS. 8G through 8I. However, a poly-silicon fin 155a and a supporting portion 145a of FIG. 8I may be formed using the method of forming the first poly-silicon fin 135a and the first supporting portion 125a, as described with reference to FIGS. 10A-10D.

Figure 11:
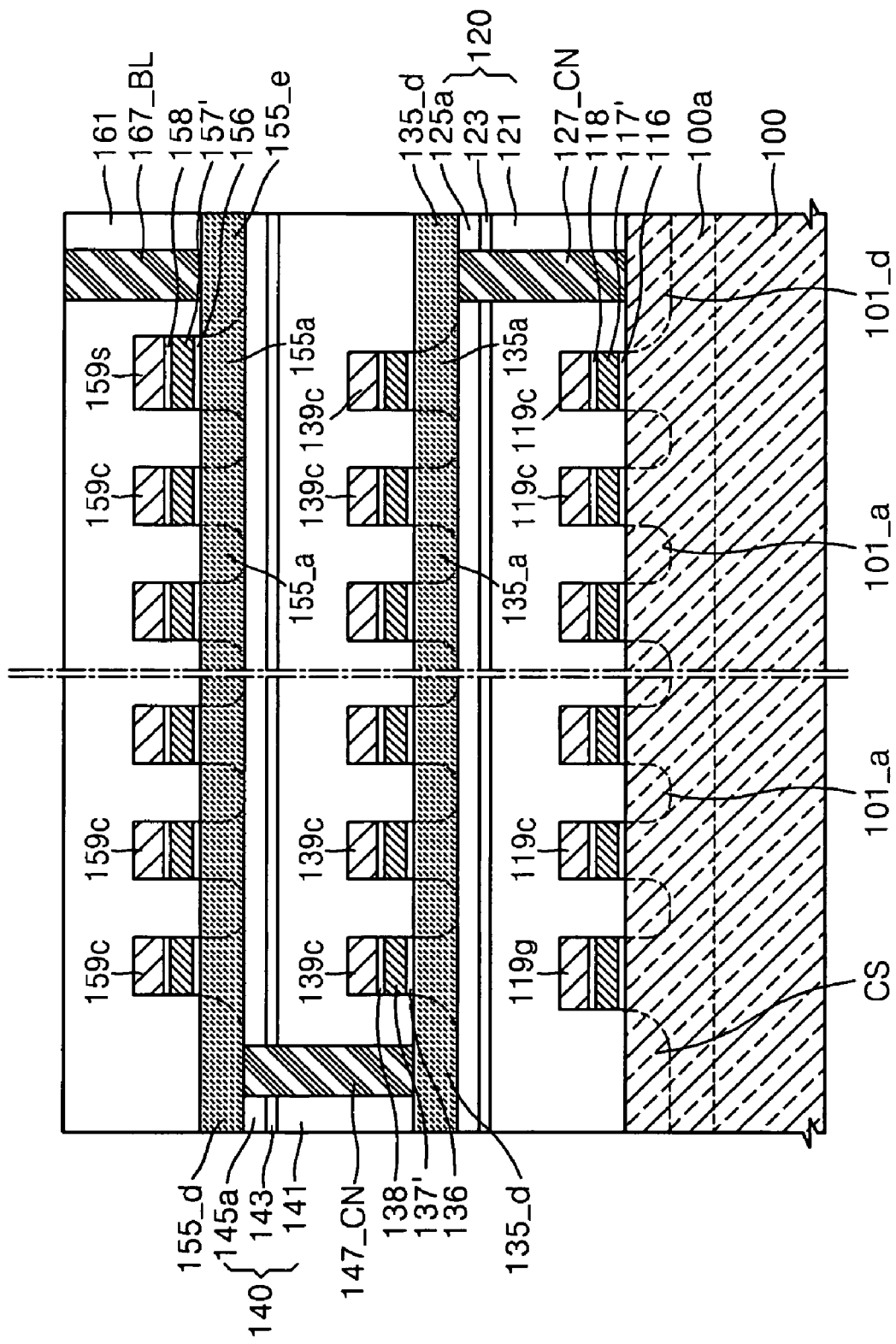

FIG. 11 is a cross-sectional view of a stacked nonvolatile memory device according to example embodiments. The stacked nonvolatile memory device according to example embodiments illustrated in FIG. 11 may be similar to the stacked non-volatile memory device described with reference to FIGS. 7, 8I and 9I, except of the following descriptions.

Referring to FIG. 11, a first ground selection line 119g intersecting over active fins 100a in a second direction may be positioned at one side of a plurality of first control gate lines 119c. A common source region CS may be formed in the active fin 100a adjacent to the first ground selection line 119g and positioned opposite to the plurality of first control gate lines 119c. A first connection impurity region 101_d may be formed in the active fin 100a such that the first connection impurity region 101_d is positioned at the other side of the plurality of first control gate lines 119c. A second connection impurity region 135_d may be formed in a first poly-silicon fin 135a such that the second connection impurity 135a_d is positioned at both sides of a plurality of second control gate lines 139c. A first string selection line 159s intersecting over second poly-silicon fins 155a may be formed at one side of a plurality of third control gate lines 159c. A bit-line contact region 155_e may be formed in the second poly-silicon fin 155a adjacent to the string selection line 159s and positioned opposite to the plurality of third control gate lines 159c. A third connection impurity region 155_d may be formed in the second poly-silicon fin 155a such that the third connection impurity region 155_d is positioned at the other side of the plurality third control gate lines 159c.

A first through connection electrode 127_CN, electrically connected to a top surface of the first connection impurity region 101_d and a bottom surface of any one of the second connection impurity regions 135_d, may be formed in a first interlayer dielectric layer 120. A second through connection electrode 147_CN, electrically connected to a top surface of the other of the second connection impurity regions 135_d and a bottom surface of the third connection impurity region 155_d, may be formed in a second interlayer dielectric layer 140. A third through bit-line electrode 167_BL, electrically connected to the bit-line contact region 155_e, may be formed in a third interlayer dielectric layer 161.

A bit line (not shown) may be electrically connected to the third through bit-line electrode 167_BL and a source line (not shown) may be electrically connected to the common source region CS. Thus, first through third strings may be connected in series with one another between a pair of bit and source lines. As a result, the nonvolatile memory device according to example embodiments may implement an integration degree about three times higher than a nonvolatile memory device having a single structure. In example embodiments, the nonvolatile memory device including three unit device layers may be described. However, example embodiments may not be limited thereto and may be applied to a device including a plurality of unit device layers.

Figure 12A:
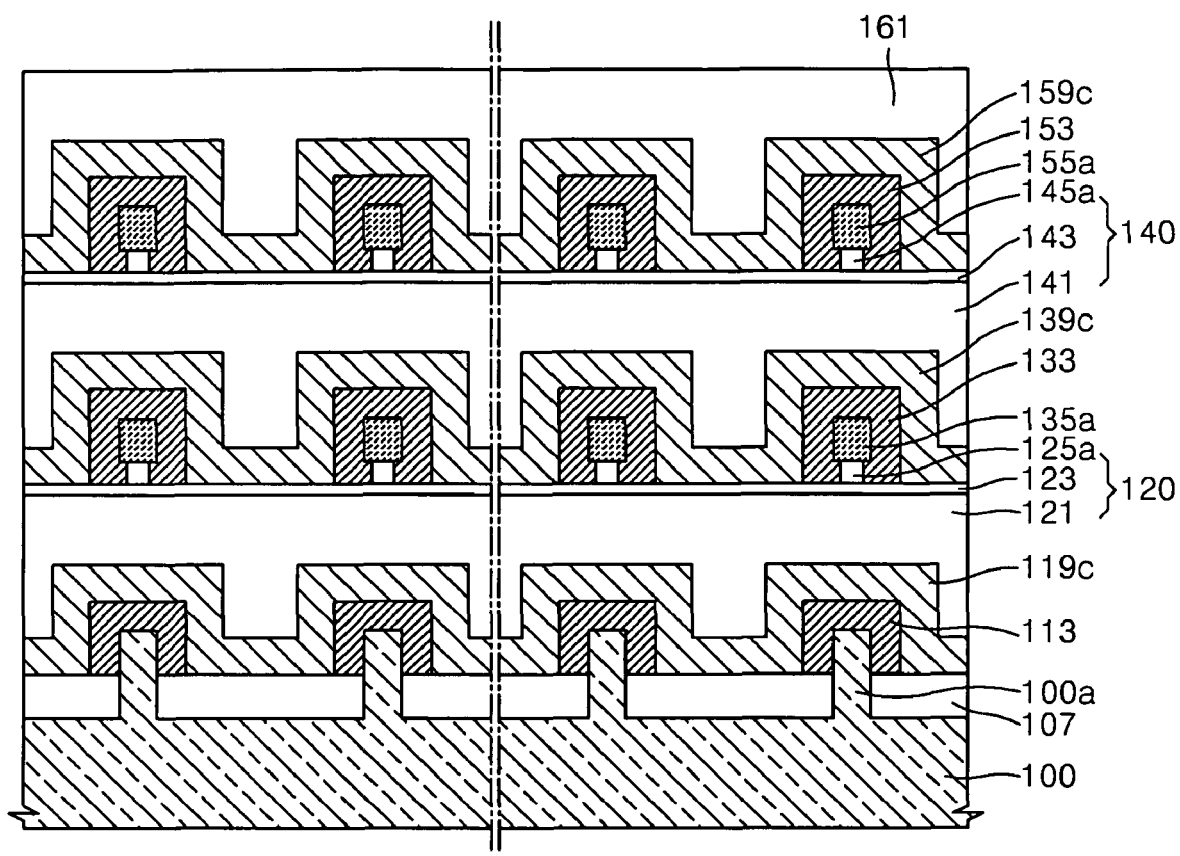
Figure 12B:
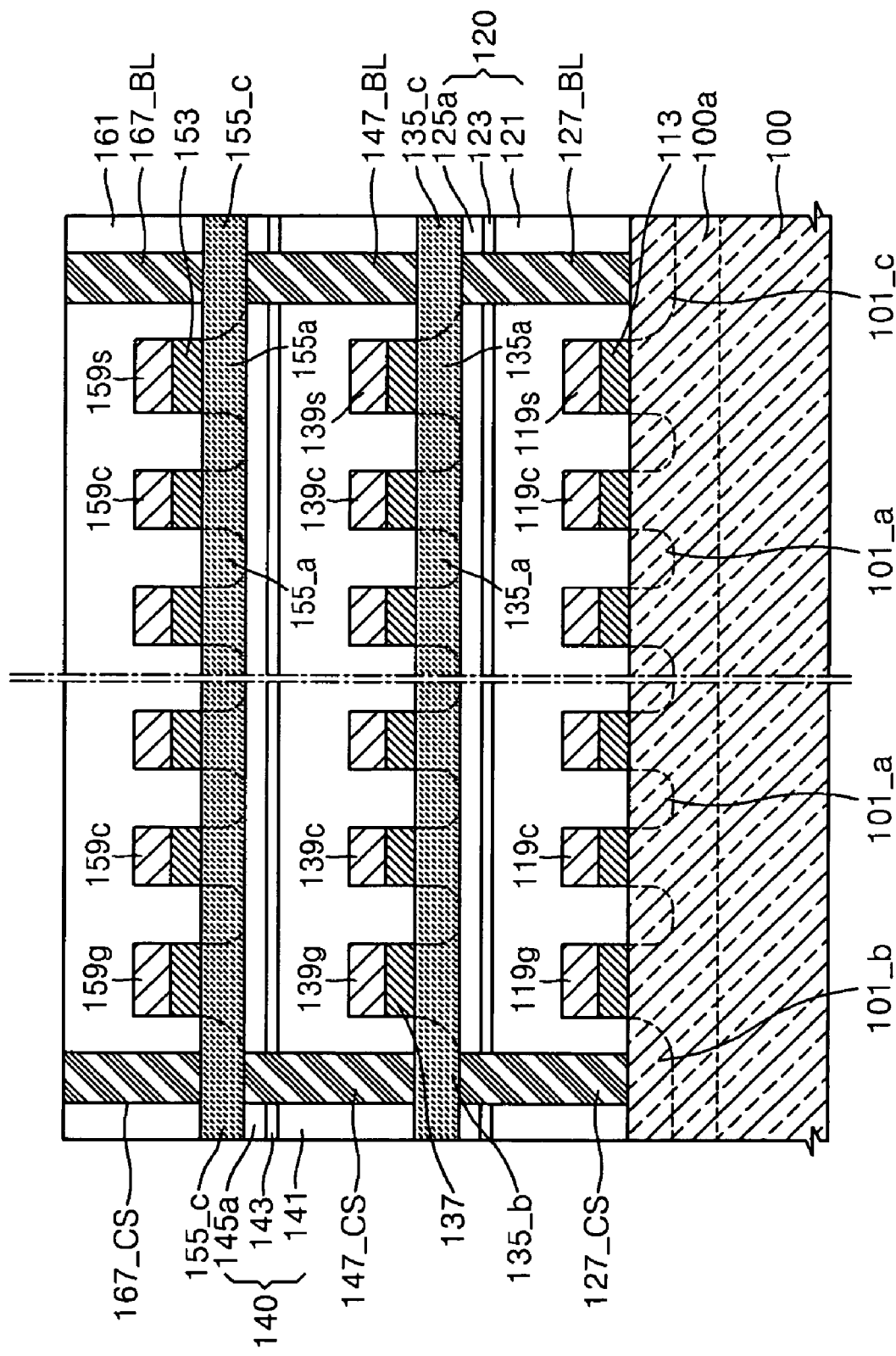

FIGS. 12A and 12B are cross-sectional views of a stacked nonvolatile memory device according to example embodiments. The device according to example embodiments illustrated in FIGS. 12A and 12B may be similar to the device described with reference to FIGS. 7, 8I and 9I, except of the following descriptions.

Referring to FIGS. 12A and 12B, first through third charge storing patterns 113, 133 and 153 may be charge trapping patterns. Specifically, each of the charge trapping pattern may be a sequentially stacked silicon oxide layer/silicon nitride layer/silicon oxide layer, e.g., an ONO layer, or a sequentially stacked silicon oxide layer/silicon nitride layer, e.g., an ON layer.

As described above, according to example embodiments, a nonvolatile memory transistor having a pole-shaped poly-silicon fin may be formed, so that a leakage current may be reduced, an on current may be increased, and a program/erase window may be improved as compared with a conventional nonvolatile memory transistor having a planar poly-silicon layer. For example, a charge storing pattern may be formed on a bottom surface of the poly-silicon fin, so that a channel width may be increased. Accordingly, a leakage current may be further reduced, an on current may be further increased, and a program/erase window may be further improved.

Amorphous silicon patterns may be crystallized using an excimer laser annealing method, so that the poly-silicon fin may have the shape of a pole and may have a width narrower than the limited resolution of the photolithography process. Furthermore, the poly-silicon fin may have a relatively large columnar-like grain.

A nonvolatile memory device having multi-layered unit device layers according to example embodiments may implement an integration degree about three times higher than a conventional nonvolatile memory device having a single structure. Furthermore, the unit device layers may include nonvolatile memory transistors each having the poly-silicon fin, so that characteristics of the device may be improved as described above.

While example embodiments have been particularly shown and described with reference to example embodiments thereof, it will be understood by those of ordinary skill in the art that various changes in form and details may be made therein without departing from the spirit and scope of the following claims.

What is claimed is:

1. A stacked nonvolatile memory device, comprising:
an active fin protruding upward from a semiconductor substrate;
at least one first charge storing pattern on a top surface and sidewalls of the active fin;
at least one first control gate line on a top surface of the at least one first charge storing pattern and intersecting over the active fin;
an interlayer dielectric layer on the at least one first control gate line;
a poly-silicon fin on the interlayer dielectric layer;
at least one second charge storing pattern on a top surface and sidewalls of the poly-silicon fin; and
at least one second control gate line on a top surface of the second charge storing pattern and intersecting over the poly-silicon fin.

2. The device of claim 1, wherein the poly-silicon fin is formed by crystallizing an amorphous silicon pattern using an excimer laser annealing method.

3. The device of claim 1, wherein the interlayer dielectric layer includes a supporting portion positioned beneath the poly-silicon fin such that the width of the supporting portion is narrower than that of the poly-silicon fin, exposing a bottom surface of the poly-silicon fin surrounding the at least one supporting portion, and wherein the at least one second charge storing pattern is on the bottom surface of the exposed poly-silicon fin.

4. The device of claim 3, wherein the interlayer dielectric layer further includes a protective layer and a lower interlayer dielectric layer, sequentially stacked beneath the supporting portion.

5. The device of claim 1, wherein the at least one first charge storing pattern is at least one first floating gate, and the at least one second charge storing pattern is at least one second floating gate, further comprising:
a first gate insulating layer between the first floating gate and the active fin;
a first inter-gate dielectric layer between the first floating gate and the at least one first control gate line;
a second gate insulating layer between the second floating gate and the poly-silicon fin; and
a second inter-gate dielectric layer between the second floating gate and the at least one second control gate line.

6. The device of claim 1, wherein the at least one first charge storing pattern is a first charge trapping pattern, and the at least one second charge storing pattern is a second charge trapping pattern.

7. The device of claim 1, wherein:
the active fin is in the shape of a line extending in a first direction,
the at least one first control gate line is a plurality of first control gate lines intersecting over the active fin in a second direction,
the at least one first charge storing pattern is a plurality of first charge storing patterns each formed beneath the first control gate lines,
the poly-silicon fin is in the shape of a line extending in the first direction on the interlayer dielectric layer;
the at least one second control gate line is a plurality of second control gate lines intersecting over the poly-silicon fin in a second direction; and
the at least one second charge storing pattern is a plurality of second charge storing patterns each formed beneath the plurality of second control gate lines and on a top surface and sidewalls of the poly-silicon fin.

8. The device of claim 7, further comprising:
a first ground selection line and a first string selection line, respectively positioned on both sides of the plurality of first control gate lines, and intersecting over the active fin in the second direction; and
a second ground selection line and a second string selection line, respectively positioned on both sides of the plurality of second control gate lines, and intersecting over the poly-silicon fin in the second direction.

9. The device of claim 8, further comprising:
a first through source electrode in the interlayer dielectric layer, and electrically connected to the top surface of the active fin adjacent to the first ground selection line and positioned opposite to the plurality of first control gate lines, and the bottom surface of the poly-silicon fin adjacent to the second ground selection line and positioned opposite to the plurality of second control gate lines; and
a first through bit-line electrode in the interlayer dielectric layer, and electrically connected to the top surface of the active fin adjacent to the first string selection line and positioned opposite to the plurality of first control gate lines, and the bottom surface of the poly-silicon fin adjacent to the second string selection line and positioned opposite to the plurality of second control gate lines.

10. The device of claim 7, further comprising:
an additional interlayer dielectric layer on the plurality of second control gate lines;
an additional poly-silicon fin in the shape of a line extending in the first direction over the additional interlayer dielectric layer;
a plurality of third control gate lines intersecting over the additional poly-silicon fin in the second direction; and
a plurality of third charge storing patterns each formed beneath the third control gate lines and on a top surface and sidewalls of the additional poly-silicon fin.

11. The device of claim 10, further comprising:
a ground selection line positioned on one side of the plurality of first control gate lines and intersecting over the active fin in the second direction;
a common source region in the active fin adjacent to the ground selection line and positioned opposite to the plurality of first control gate lines;
a first through connection electrode in the interlayer dielectric layer and electrically connected to the top surface of the active fin positioned on the other side of the plurality of first control gate lines and the bottom surface of the poly-silicon fin positioned on one side of the plurality of second control gate lines;
a second through connection electrode positioned in the additional interlayer dielectric layer and electrically connected to the top surface of the poly-silicon fin positioned on the other side of the plurality of second control gate lines and the bottom surface of the additional poly-silicon fin exposed on one side of the plurality of third control gate lines;
a string selection line positioned on the other side of the plurality of third control gate lines and intersecting over the additional poly-silicon fin in the second direction; and
a bit line electrode electrically connected to the additional poly-silicon fin adjacent to the string selection line and positioned opposite to the plurality of third control gate lines.

12. A nonvolatile memory transistor, comprising:
a supporting portion on a substrate;
a poly-silicon fin on the supporting portion and having a broader width than the supporting portion;
a charge storing pattern on a top surface, sidewalls and a bottom surface of the poly-silicon fin; and
a control gate line on a top surface of the charge storing pattern and intersecting over the poly-silicon fin.

13. The transistor of claim 12, wherein the poly-silicon fin is formed by crystallizing an amorphous silicon pattern using an excimer laser annealing method.

14. The transistor of claim 12, wherein the charge storing pattern is a floating gate, further comprising:
a gate insulating layer between the floating gate and the poly-silicon fin; and
an inter-gate dielectric layer between the floating gate and the control gate line.

15. The transistor of claim 12, wherein the charge storing pattern is a charge trapping pattern.

* * * * *